United States Patent
Biberger et al.

(10) Patent No.: US 7,060,422 B2
(45) Date of Patent: Jun. 13, 2006

(54) METHOD OF SUPERCRITICAL PROCESSING OF A WORKPIECE

(75) Inventors: Maximilian Albert Biberger, Palo Alto, CA (US); Frederick Paul Layman, Fremont, CA (US); Thomas Robert Sutton, San Jose, CA (US)

(73) Assignee: Tokyo Electron Limited, Tokyo (JP)

( * ) Notice: Subject to any disclaimer, the term of this patent is extended or adjusted under 35 U.S.C. 154(b) by 64 days.

(21) Appl. No.: 10/346,445

(22) Filed: Jan. 15, 2003

(65) Prior Publication Data

US 2003/0136514 A1 Jul. 24, 2003

Related U.S. Application Data

(62) Division of application No. 09/704,641, filed on Nov. 1, 2000.

(60) Provisional application No. 60/163,121, filed on Nov. 2, 1999.

(51) Int. Cl.
*H01L 21/00* (2006.01)
*C23C 16/00* (2006.01)

(52) U.S. Cl. ............ 430/329; 156/345.32; 156/345.51; 414/935; 134/61; 134/1.2; 134/1.3

(58) Field of Classification Search ............ 156/345.32, 156/345.51, 345.11, 345.12; 134/61, 1.2, 134/1.3, 1.1; 430/329; 414/935; 118/715, 118/719

See application file for complete search history.

(56) References Cited

U.S. PATENT DOCUMENTS 2,617,719 A   11/1952   Stewart ............ 23/312
2,625,886 A   1/1953   Browne
3,623,627 A   11/1971   Bolton ............ 220/41

(Continued)

FOREIGN PATENT DOCUMENTS

| CN | 1399790 A | 2/2003 |
|---|---|---|
| DE | 36 08 783 A1 | 9/1987 |
| DE | 39 04 514 C2 | 8/1990 |

(Continued)

OTHER PUBLICATIONS

Edward Bok et al (Article Super critical Fluids for Single wafer Cleaning, Solid State Technology, Jun. 1992).*

(Continued)

*Primary Examiner*—Gregory Mills
*Assistant Examiner*—Ram N Kackar
(74) *Attorney, Agent, or Firm*—Haverstock & Owens LLP

(57) ABSTRACT

An apparatus for supercritical processing and non-supercritical processing of a workpiece comprises a transfer module, a supercritical processing module, a non-supercritical processing module, and a robot. The transfer module includes an entrance. The supercritical processing module and the non-supercritical processing module are coupled to the transfer module. The robot is preferably located within the transfer module. In operation, the robot transfers a workpiece from the entrance of the transfer module to the supercritical processing module. After supercritical processing, the robot then transfers workpiece from the supercritical processing module to the non-supercritical processing module. After the non-supercritical processing, the robot returns the workpiece to the entrance of the transfer module. Alternatively, the non-supercritical processing is performed before the supercritical processing.

21 Claims, 9 Drawing Sheets

U.S. PATENT DOCUMENTS

| | | |
|---|---|---|
| 3,689,025 A | 9/1972 | Kiser |
| 3,744,660 A | 7/1973 | Gaines et al. |
| 3,890,176 A | 6/1975 | Bolon ............................ 156/2 |
| 3,900,551 A | 8/1975 | Bardoncelli et al. ........... 423/9 |
| 3,968,885 A | 7/1976 | Hassan et al. |
| 4,029,517 A | 6/1977 | Rand ............................ 134/11 |
| 4,091,643 A | 5/1978 | Zucchini ..................... 68/18 C |
| 4,219,333 A | 8/1980 | Harris ............................ 8/137 |
| 4,245,154 A | 1/1981 | Uehara et al. |
| 4,341,592 A | 7/1982 | Shortes et al. ............... 156/643 |
| 4,355,937 A | 10/1982 | Mack et al. |
| 4,367,140 A | 1/1983 | Wilson |
| 4,406,596 A | 9/1983 | Budde |
| 4,422,651 A | 12/1983 | Platts |
| 4,426,358 A | 1/1984 | Johansson ................... 422/112 |
| 4,474,199 A | 10/1984 | Blaudszun .................. 134/105 |
| 4,475,993 A | 10/1984 | Blander et al. ........... 204/64 T |
| 4,522,788 A | 6/1985 | Sitek et al. |
| 4,549,467 A | 10/1985 | Wilden et al. |
| 4,574,184 A | 3/1986 | Wolf et al. .................. 219/440 |
| 4,592,306 A | 6/1986 | Gallego ....................... 118/719 |
| 4,601,181 A | 7/1986 | Privat ........................ 68/18 C |
| 4,626,509 A | 12/1986 | Lyman |
| 4,670,126 A | 6/1987 | Messer et al. ............... 204/298 |
| 4,682,937 A | 7/1987 | Credle, Jr. |
| 4,693,777 A | 9/1987 | Hazano et al. ............... 156/345 |
| 4,749,440 A | 6/1988 | Blackwood et al. ........ 156/646 |
| 4,778,356 A | 10/1988 | Hicks |
| 4,788,043 A | 11/1988 | Kagiyama et al. .......... 422/292 |
| 4,789,077 A | 12/1988 | Noe |
| 4,823,976 A | 4/1989 | White, III et al. |
| 4,825,808 A | 5/1989 | Takahashi et al. .......... 118/719 |
| 4,827,867 A | 5/1989 | Takei et al. |
| 4,838,476 A | 6/1989 | Rahn ...................... 228/180.1 |
| 4,865,061 A | 9/1989 | Fowler et al. ............... 134/108 |
| 4,877,530 A | 10/1989 | Moses ........................ 210/511 |
| 4,879,004 A | 11/1989 | Oesch et al. .................... 203/89 |
| 4,879,431 A | 11/1989 | Bertoncini |
| 4,917,556 A | 4/1990 | Stark et al. .................. 414/217 |
| 4,923,828 A | 5/1990 | Gluck et al. ................. 437/225 |
| 4,924,892 A | 5/1990 | Kiba et al. ................... 134/123 |
| 4,933,404 A | 6/1990 | Beckman et al. ........... 526/207 |
| 4,944,837 A | 7/1990 | Nishikawa et al. .......... 156/646 |
| 4,951,601 A | 8/1990 | Maydan et al. .............. 118/719 |
| 4,960,140 A | 10/1990 | Ishijima et al. ............... 134/31 |
| 4,983,223 A | 1/1991 | Gessner ...................... 134/25.4 |
| 5,011,542 A | 4/1991 | Weil ............................ 134/38 |
| 5,013,366 A | 5/1991 | Jackson et al. ................. 134/1 |
| 5,044,871 A | 9/1991 | Davis et al. |
| 5,062,770 A | 11/1991 | Story et al. |
| 5,068,040 A | 11/1991 | Jackson ..................... 210/748 |
| 5,071,485 A | 12/1991 | Matthews et al. |
| 5,105,556 A | 4/1992 | Kurokawa et al. ............. 34/12 |
| 5,143,103 A | 9/1992 | Basso et al. ................ 134/98.1 |
| 5,158,704 A | 10/1992 | Fulton et al. ................ 252/309 |
| 5,167,716 A | 12/1992 | Boitnott et al. |
| 5,169,296 A | 12/1992 | Wilden |
| 5,169,408 A | 12/1992 | Biggerstaff et al. |
| 5,174,917 A | 12/1992 | Monzyk ....................... 252/60 |
| 5,185,058 A | 2/1993 | Cathey, Jr. .................. 156/656 |
| 5,185,296 A | 2/1993 | Morita et al. ............... 437/229 |
| 5,186,594 A | 2/1993 | Toshima et al. |
| 5,186,718 A | 2/1993 | Tepman et al. ............ 29/25.01 |
| 5,188,515 A | 2/1993 | Horn |
| 5,190,373 A | 3/1993 | Dickson et al. |
| 5,191,993 A | 3/1993 | Wanger et al. |
| 5,193,560 A | 3/1993 | Tanaka et al. ............ 134/56 R |
| 5,195,878 A | 3/1993 | Sahiavo et al. |
| 5,201,960 A | 4/1993 | Starov ......................... 134/11 |
| 5,213,485 A | 5/1993 | Wilden |
| 5,213,619 A | 5/1993 | Jackson et al. ................. 134/1 |
| 5,215,592 A | 6/1993 | Jackson .......................... 134/1 |
| 5,221,019 A | 6/1993 | Pechacek et al. |
| 5,222,876 A | 6/1993 | Budde |
| 5,224,504 A | 7/1993 | Thompson et al. |
| 5,225,173 A | 7/1993 | Wai ............................. 423/2 |
| 5,236,602 A | 8/1993 | Jackson ..................... 210/748 |
| 5,236,669 A | 8/1993 | Simmons et al. |
| 5,237,824 A | 8/1993 | Pawliszyn ................... 62/51.1 |
| 5,238,671 A | 8/1993 | Matson et al. .............. 423/397 |
| 5,240,390 A | 8/1993 | Kvinge et al. |
| 5,243,821 A | 9/1993 | Schuck et al. |
| 5,246,500 A | 9/1993 | Samata et al. |
| 5,250,078 A | 10/1993 | Saus et al. ..................... 8/475 |
| 5,251,776 A | 10/1993 | Morgan, Jr. et al. |
| 5,261,965 A | 11/1993 | Moslehi ........................ 134/1 |
| 5,266,205 A | 11/1993 | Fulton et al. ............... 210/639 |
| 5,267,455 A | 12/1993 | Dewees et al. ............. 68/5 C |
| 5,269,815 A | 12/1993 | Schlenker et al. ............. 8/475 |
| 5,274,129 A | 12/1993 | Natale et al. ............... 549/349 |
| 5,280,693 A | 1/1994 | Heudecker |
| 5,285,352 A | 2/1994 | Pastore et al. |
| 5,288,333 A | 2/1994 | Tanaka et al. ................ 134/31 |
| 5,290,361 A | 3/1994 | Hayashida et al. ............. 134/2 |
| 5,294,261 A | 3/1994 | McDermott et al. ........... 134/7 |
| 5,298,032 A | 3/1994 | Schlenker et al. ............. 8/475 |
| 5,304,515 A | 4/1994 | Morita et al. ............... 437/231 |
| 5,306,350 A | 4/1994 | Hoy et al. ................ 134/22.14 |
| 5,312,882 A | 5/1994 | DeSimone et al. .......... 526/201 |
| 5,313,965 A | 5/1994 | Palen .......................... 134/61 |
| 5,314,574 A | 5/1994 | Takahashi .................... 156/646 |
| 5,316,591 A | 5/1994 | Chao et al. .................. 134/34 |
| 5,328,722 A | 7/1994 | Ghanayem et al. ......... 427/250 |
| 5,334,332 A | 8/1994 | Lee ............................. 252/548 |
| 5,334,493 A | 8/1994 | Fujita et al. ................. 430/463 |
| 5,337,446 A | 8/1994 | Smith et al. .................. 15/21.1 |
| 5,339,844 A | 8/1994 | Stanford, Jr. et al. ........ 134/107 |
| 5,352,327 A | 10/1994 | Witowski .................... 156/646 |
| 5,355,901 A | 10/1994 | Mielnik et al. .............. 134/105 |
| 5,356,538 A | 10/1994 | Wai et al. ................... 210/634 |
| 5,364,497 A | 11/1994 | Chau et al. .................. 156/645 |
| 5,368,171 A | 11/1994 | Jackson ..................... 134/147 |
| 5,370,740 A | 12/1994 | Chao et al. ..................... 134/1 |
| 5,370,741 A | 12/1994 | Bergman |
| 5,370,742 A | 12/1994 | Mitchell et al. .............. 134/10 |
| 5,374,829 A | 12/1994 | Sakamoto et al. ..... 250/453.11 |
| 5,377,705 A | 1/1995 | Smith, Jr. et al. .......... 134/95.3 |
| 5,401,322 A | 3/1995 | Marshall ..................... 134/13 |
| 5,403,621 A | 4/1995 | Jackson et al. ........... 427/255.1 |
| 5,403,665 A | 4/1995 | Alley et al. ................. 428/447 |
| 5,404,894 A | 4/1995 | Shiraiwa ..................... 134/66 |
| 5,412,958 A | 5/1995 | Iliff et al. ..................... 638/5 C |
| 5,417,768 A | 5/1995 | Smith, Jr. et al. ............. 134/10 |
| 5,433,334 A | 7/1995 | Reneau |
| 5,447,294 A | 9/1995 | Sakata et al. |
| 5,456,759 A | 10/1995 | Stanford, Jr. et al. ........... 134/1 |
| 5,470,393 A | 11/1995 | Fukazawa ..................... 134/3 |
| 5,474,410 A | 12/1995 | Ozawa et al. ............... 414/217 |
| 5,474,812 A | 12/1995 | Truckenmuller et al. 427/430.1 |
| 5,482,564 A | 1/1996 | Douglas et al. .............. 134/18 |
| 5,486,212 A | 1/1996 | Mitchell et al. ............... 8/142 |
| 5,494,526 A | 2/1996 | Paranjpe ....................... 134/1 |
| 5,500,081 A | 3/1996 | Bergman ................. 156/646.1 |
| 5,501,761 A | 3/1996 | Evans et al. ................. 156/344 |
| 5,503,176 A | 4/1996 | Dunmire et al. |
| 5,505,219 A | 4/1996 | Lansberry et al. .......... 134/105 |
| 5,509,431 A | 4/1996 | Smith, Jr. et al. ......... 134/95.1 |
| 5,514,220 A | 5/1996 | Wetmore et al. ......... 134/22.18 |
| 5,522,938 A | 6/1996 | O'Brien ........................ 134/1 |
| 5,526,834 A | 6/1996 | Mielnik et al. .............. 134/105 |
| 5,533,538 A | 7/1996 | Marshall ................... 134/104.4 |

| | | | | | | |
|---|---|---|---|---|---|---|
| 5,547,774 A | | 8/1996 | Gimzewski et al. ... 428/694 MI | 5,981,399 A * | 11/1999 | Kawamura et al. ......... 438/715 |
| 5,550,211 A | | 8/1996 | DeCrosta et al. ............ 528/480 | 5,989,342 A | 11/1999 | Ikeda et al. |
| 5,571,330 A | | 11/1996 | Kyogoku | 6,005,226 A | 12/1999 | Aschner et al. |
| 5,580,846 A | | 12/1996 | Hayashida et al. .......... 510/175 | 6,017,820 A | 1/2000 | Ting et al. .................. 438/689 |
| 5,589,082 A | | 12/1996 | Lin et al. ....................... 216/2 | 6,021,791 A | 2/2000 | Dryer et al. |
| 5,589,105 A | | 12/1996 | DeSimone et al. ......... 252/351 | 6,024,801 A * | 2/2000 | Wallace et al. ................ 134/1 |
| 5,589,224 A | | 12/1996 | Tepman et al. | 6,029,371 A | 2/2000 | Kamikawa et al. |
| 5,621,982 A | | 4/1997 | Yamashita et al. | 6,035,871 A | 3/2000 | Eui-Yeol ..................... 134/61 |
| 5,629,918 A | | 5/1997 | Ho et al. ..................... 369/112 | 6,037,277 A | 3/2000 | Masakara et al. |
| 5,632,847 A | | 5/1997 | Ohno et al. ................. 156/344 | 6,048,494 A | 4/2000 | Annapragada ................ 422/33 |
| 5,635,463 A | | 6/1997 | Muraoka ..................... 510/175 | 6,053,348 A | 4/2000 | Morch |
| 5,637,151 A | | 6/1997 | Schulz ........................... 134/2 | 6,056,008 A | 5/2000 | Adams et al. |
| 5,641,887 A | | 6/1997 | Beckman et al. .......... 546/26.2 | 6,062,853 A | 5/2000 | Shimazu et al. ............. 432/258 |
| 5,644,855 A | | 7/1997 | McDermott et al. | 6,067,728 A | 5/2000 | Farmer et al. ................ 34/470 |
| 5,649,809 A | | 7/1997 | Stapelfeldt | 6,070,440 A | 6/2000 | Malchow et al. |
| 5,656,097 A | | 8/1997 | Olesen et al. .................. 134/1 | 6,077,053 A | 6/2000 | Fujikawa et al. ............ 417/399 |
| 5,665,527 A | | 9/1997 | Allen et al. .................. 430/325 | 6,077,321 A | 6/2000 | Adachi et al. ............. 29/25.01 |
| 5,669,251 A | | 9/1997 | Townsend et al. .............. 68/58 | 6,082,150 A | 7/2000 | Stucker |
| 5,672,204 A | | 9/1997 | Habuka ....................... 117/204 | 6,085,935 A | 7/2000 | Malchow et al. |
| 5,676,705 A | | 10/1997 | Jureller et al. .................. 8/142 | 6,089,377 A | 7/2000 | Shimizu ..................... 206/711 |
| 5,679,169 A | | 10/1997 | Gonzales et al. ............ 134/1.3 | 6,097,015 A | 8/2000 | McCullough et al. |
| 5,679,171 A | | 10/1997 | Saga et al. ..................... 134/3 | 6,109,296 A | 8/2000 | Austin |
| 5,683,473 A | | 11/1997 | Jureller et al. .................. 8/142 | 6,110,232 A | 8/2000 | Chen et al. ................ 29/25.01 |
| 5,683,977 A | | 11/1997 | Jureller et al. ............. 510/286 | 6,114,044 A | 9/2000 | Houston et al. ............. 428/447 |
| 5,688,879 A | | 11/1997 | DeSimone ................... 526/89 | 6,122,566 A * | 9/2000 | Nguyen et al. .............. 700/218 |
| 5,700,379 A | | 12/1997 | Biebl ............................ 216/2 | 6,128,830 A | 10/2000 | Bettcher et al. |
| 5,702,228 A | * | 12/1997 | Tamai et al. ............. 414/744.5 | 6,145,519 A | 11/2000 | Konishi et al. |
| 5,706,319 A | | 1/1998 | Holtz | 6,149,828 A | 11/2000 | Vaartstra ....................... 216/57 |
| 5,726,211 A | | 3/1998 | Hedrick et al. ............... 521/61 | 6,159,295 A | 12/2000 | Maskara et al. |
| 5,730,874 A | | 3/1998 | Wai et al. .................... 210/638 | 6,164,297 A | 12/2000 | Kamikawa |
| 5,739,223 A | | 4/1998 | DeSimone ................... 526/89 | 6,186,722 B1 | 2/2001 | Shirai ......................... 414/217 |
| 5,746,008 A | | 5/1998 | Yamashita et al. | 6,200,943 B1 | 3/2001 | Romack et al. ............. 510/285 |
| 5,769,588 A | | 6/1998 | Toshima et al. | 6,203,582 B1 | 3/2001 | Berner et al. |
| 5,772,783 A | | 6/1998 | Stucker | 6,216,364 B1 | 4/2001 | Tanaka et al. |
| 5,783,082 A | | 7/1998 | DeSimone et al. ......... 210/634 | 6,224,774 B1 | 5/2001 | DeSimone et al. ......... 210/634 |
| 5,797,719 A | | 8/1998 | James et al. .................. 417/46 | 6,228,563 B1 | 5/2001 | Starov et al. ................ 430/327 |
| 5,798,126 A | | 8/1998 | Fujikawa et al. .............. 425/78 | 6,228,826 B1 | 5/2001 | DeYoung et al. ............ 510/291 |
| 5,798,438 A | | 8/1998 | Sawan et al. ................ 528/483 | 6,235,634 B1 | 5/2001 | White et al. ................. 438/680 |
| 5,804,607 A | | 9/1998 | Hedrick et al. ............... 521/64 | 6,239,038 B1 | 5/2001 | Wen |
| 5,817,178 A | | 10/1998 | Mita et al. ................... 118/666 | 6,241,825 B1 | 6/2001 | Wytman |
| 5,850,747 A | | 12/1998 | Roberts et al. | 6,242,165 B1 | 6/2001 | Vaartstra ..................... 430/329 |
| 5,858,107 A | | 1/1999 | Chao et al. | 6,244,121 B1 | 6/2001 | Hunter ....................... 73/865.9 |
| 5,866,005 A | | 2/1999 | DeSimone et al. ......... 210/634 | 6,251,250 B1 | 6/2001 | Keigler |
| 5,868,856 A | | 2/1999 | Douglas et al. ................ 134/2 | 6,264,753 B1 | 7/2001 | Chao et al. |
| 5,868,862 A | | 2/1999 | Douglas et al. ............... 134/26 | 6,277,753 B1 | 8/2001 | Mullee et al. |
| 5,872,257 A | | 2/1999 | Beckman et al. ........... 546/336 | 6,286,231 B1 | 9/2001 | Bergman et al. |
| 5,873,948 A | | 2/1999 | Kim ............................ 134/19 | 6,305,677 B1 | 10/2001 | Lenz |
| 5,879,459 A | | 3/1999 | Gadgil et al. ................ 118/715 | 6,306,564 B1 * | 10/2001 | Mullee ....................... 430/329 |
| 5,881,577 A | | 3/1999 | Sauer et al. ...................... 68/5 | 6,319,858 B1 | 11/2001 | Lee et al. .................... 438/787 |
| 5,882,165 A | | 3/1999 | Maydan et al. ............. 414/217 | 6,334,266 B1 | 1/2002 | Moritz et al. |
| 5,888,050 A | | 3/1999 | Fitzgerald et al. ............ 417/46 | 6,344,174 B1 | 2/2002 | Miller et al. |
| 5,898,727 A | | 4/1999 | Fujikawa et al. ............ 373/110 | 6,355,072 B1 | 3/2002 | Racette et al. |
| 5,900,107 A | | 5/1999 | Murphy et al. | 6,388,317 B1 | 5/2002 | Reese |
| 5,900,354 A | | 5/1999 | Batchelder ................. 430/395 | 6,389,677 B1 | 5/2002 | Lenz |
| 5,904,737 A | | 5/1999 | Preston et al. | 6,406,782 B1 | 6/2002 | Johnson et al. .......... 428/317.7 |
| 5,906,866 A | * | 5/1999 | Webb ........................ 427/534 | 6,418,956 B1 | 7/2002 | Bloom |
| 5,908,510 A | | 6/1999 | McCullough et al. .......... 134/2 | 6,436,824 B1 | 8/2002 | Chooi et al. |
| 5,928,389 A | | 7/1999 | Jevtic ....................... 29/25.01 | 6,454,519 B1 | 9/2002 | Toshima et al. |
| 5,932,100 A | | 8/1999 | Yager et al. ................. 210/634 | 6,454,945 B1 | 9/2002 | Weigl et al. |
| 5,934,856 A | | 8/1999 | Asakawa et al. ............ 414/217 | 6,464,790 B1 | 10/2002 | Shertinsky et al. |
| 5,934,991 A | | 8/1999 | Rush | 6,465,403 B1 | 10/2002 | Skee |
| 5,943,721 A | | 8/1999 | Lerette et al. | 6,508,259 B1 | 1/2003 | Tseronis et al. ............. 134/105 |
| 5,944,996 A | * | 8/1999 | DeSimone et al. ......... 210/634 | 6,509,141 B1 | 1/2003 | Mullee |
| 5,946,945 A | | 9/1999 | Kegler et al. | 6,521,466 B1 | 2/2003 | Castrucci |
| 5,955,140 A | | 9/1999 | Smith et al. ................. 427/96 | 6,541,278 B1 | 4/2003 | Morita et al. |
| 5,965,025 A | | 10/1999 | Wai et al. .................... 210/634 | 6,546,946 B1 | 4/2003 | Dunmire |
| 5,970,554 A | | 10/1999 | Shore et al. | 6,550,484 B1 | 4/2003 | Gopinath et al. |
| 5,975,492 A | * | 11/1999 | Brenes ....................... 251/175 | 6,558,475 B1 | 5/2003 | Jur et al. |
| 5,976,264 A | | 11/1999 | McCullough et al. ........... 134/2 | 6,561,213 B1 | 5/2003 | Wang et al. |
| 5,979,306 A | * | 11/1999 | Fujikawa et al. ............ 100/90 | 6,561,220 B1 | 5/2003 | McCullough et al. |
| 5,980,648 A | | 11/1999 | Adler .......................... 134/34 | 6,561,481 B1 | 5/2003 | Filonczuk |

| | | | |
|---|---|---|---|
| 6,561,767 B1 | 5/2003 | Berger et al. | |
| 6,564,826 B1 | 5/2003 | Shen | |
| 6,612,317 B1 | 9/2003 | Costantini et al. | |
| 6,635,565 B1 | 10/2003 | Wu et al. | |
| 6,641,678 B1 | 11/2003 | DeYoung et al. | |
| 6,736,149 B1 | 5/2004 | Biberger et al. | |
| 6,764,552 B1 | 7/2004 | Joyce et al. | |
| 6,805,801 B1 | 10/2004 | Humayun et al. | |
| 6,851,148 B1 | 2/2005 | Preston et al. | |
| 2001/0050096 A1 | 12/2001 | Constantini et al. | 134/58 R |
| 2002/0001929 A1 | 1/2002 | Biberger et al. | |
| 2003/0205510 A1 | 11/2003 | Jackson | |
| 2004/0020518 A1 | 2/2004 | DeYoung et al. | |

FOREIGN PATENT DOCUMENTS

| | | |
|---|---|---|
| DE | 40 04 111 C2 | 8/1990 |
| DE | 39 06 724 C2 | 9/1990 |
| DE | 39 06 735 C2 | 9/1990 |
| DE | 39 06 737 A1 | 9/1990 |
| DE | 44 29 470 A1 | 3/1995 |
| DE | 43 44 021 A1 | 6/1995 |
| DE | 198 60 084 A1 | 7/2000 |
| EP | 0 244 951 A2 | 11/1987 |
| EP | 0 272 141 A2 | 6/1988 |
| EP | 0 283 740 A2 | 9/1988 |
| EP | 0 302 345 A2 | 2/1989 |
| EP | 0 370 233 A1 | 5/1990 |
| EP | 0 391 035 A2 | 10/1990 |
| EP | 0 453 867 A1 | 10/1991 |
| EP | 0 518 653 B1 | 12/1992 |
| EP | 0 536 752 A2 | 4/1993 |
| EP | 0 572 913 A1 | 12/1993 |
| EP | 0 587 168 A1 | 3/1994 |
| EP | 0 620 270 A3 | 10/1994 |
| EP | 0 679 753 B1 | 11/1995 |
| EP | 0 711 864 B1 | 5/1996 |
| EP | 0 726 099 A2 | 8/1996 |
| EP | 0 822 583 A2 | 2/1998 |
| EP | 0 829 312 A2 | 3/1998 |
| EP | 0 836 895 A2 | 4/1998 |
| EP | 0 903 775 A2 | 3/1999 |
| FR | 1.499.491 | 9/1967 |
| GB | 2 003 975 | 3/1979 |
| GB | 2 193 482 A | 11/1987 |
| JP | 56-142629 | 11/1981 |
| JP | 60-192333 | 9/1985 |
| JP | 60-238479 | 11/1985 |
| JP | 60-246635 | 12/1985 |
| JP | 61-017151 | 1/1986 |
| JP | 61-231166 | 10/1986 |
| JP | 62-125619 | 6/1987 |
| JP | 63-303059 | 12/1988 |
| JP | 1045131 | 2/1989 |
| JP | 2-148841 | 6/1990 |
| JP | 2-209729 | 8/1990 |
| JP | 2-304941 | 12/1990 |
| JP | 40 5283511 A | 10/1993 |
| JP | 7142333 | 6/1995 |
| JP | 727711 | 2/1996 |
| JP | 8-186140 | 7/1996 |
| JP | 8-206485 | 8/1996 |
| JP | 8222508 | 8/1996 |
| JP | 10-144757 | 5/1998 |
| JP | 10-335408 | 12/1998 |
| JP | 11200035 A * | 7/1999 |
| JP | 11-200035 | 7/1999 |
| JP | 2000-106358 | 4/2000 |
| JP | 2001-77074 | 3/2001 |
| SE | 251213 | 8/1948 |
| WO | WO 87/07309 A1 | 12/1987 |
| WO | WO 90/06189 | 6/1990 |
| WO | WO 90/13675 | 11/1990 |
| WO | WO 91/12629 | 8/1991 |
| WO | WO 93/14255 | 7/1993 |
| WO | WO 93/14259 | 7/1993 |
| WO | WO 93/20116 | 10/1993 |
| WO | WO 96/27704 | 9/1996 |
| WO | WO 99/18603 | 4/1999 |
| WO | WO 99/49998 | 10/1999 |
| WO | WO 00/36635 | 6/2000 |
| WO | WO 01/10733 A1 | 2/2001 |
| WO | WO 01/33615 A3 | 5/2001 |
| WO | WO 01/55628 A1 | 8/2001 |
| WO | WO 01/68279 A2 | 9/2001 |
| WO | WO 01/74538 A1 | 10/2001 |
| WO | WO 01/78911 A1 | 10/2001 |
| WO | WO 01/85391 A2 | 11/2001 |
| WO | WO 01/94782 A3 | 12/2001 |
| WO | WO 02/16051 A2 | 2/2002 |
| WO | WO 03/030219 A2 | 10/2003 |

OTHER PUBLICATIONS

J.B. Rubin et al., "A Comparison of Chilled DI Water/Ozone and Co2–Based Supercritical Fluids as Replacements for Photoresist–Stripping Solvents" 1998, pp. 308–314, IEEE/CPMT Int'l Electronics Manufacturing Technology Symposium.

"Los Almos National Laboratory," Solid State Technology, pp. S10 & S14, Oct. 1998.

"Supercritical Carbon Dioxide Resist Remover, SCORR, the Path to Least Photoresistance," Los Almos National Laboratory, 1998.

Guan, Z. et al., "Fluorocarbon–Based Heterophase Polymeric Materials. 1. Block Copolymer Surfactants for Carbon Dioxide Applications," Macromolecules, vol. 27, 1994, pp. 5527–5532.

International Journal of Environmentally Conscious Design & Manufacturing, vol. 2, No. 1, 1993, p. 83.

Matson and Smith "Supercritical Fluids", Journal of the American Ceramic Society, vol. 72, No. 6, pp. 872–874.

Ziger, D.H. et al., "Compressed Fluid Technology: Application to RIE Developed Resists," AIChE Journal, vol. 33, No. 10, Oct. 1987, pp. 1585–1591.

Kirk–Othmer, "Alcohol Fuels to Toxicology," Encyclopedia of Chemical Terminology, 3rd ed., Supplement Volume, 1984, pp. 872–893.

"Cleaning with Supercritical $CO_2$," NASA Tech Briefs, MFS–29611, Marshall Space Flight Center, Alabama, Mar. 1979.

Basta, N., "Supercritical Fluids: Still Seeking Acceptance," Chemical Engineering, vol. 92, No. 3, Feb. 24, 1985, pp. 1–4.

Takahashi, D., "Los Alomos Lab Finds Way to Cut Chip Toxic Waste," Wall Street Journal, Jun. 22, 1998.

"Supercritical CO2 Process Offers Less Mess from Semiconductor Plants", Chemical Engineering Magazine, pp. 27 & 29, Jul. 1998.

Sun, Y.P. et al., "Preparation of Polymer–Protected Semiconductor Nanoparticles Through the Rapid Epansion of Supercritical Fluid Solution," Chemical Physics Letters, pp. 585–588, May 22, 1998.

Jackson, K. et al., "Surfactants and Micromulsions in Supercritical Fluids," Supercritical Fluid Cleaning. Noyes Publications, Westwood, NJ, pp. 87–120, Spring 1998.

Kryszewski, M., "Production of Metal and Semiconductor Nanoparticles in Polymer Systems," Polymery, pp. 65–73, Feb. 1998.

Bakker, G.L. et al., "Surface Cleaning and Carbonaceous Film Removal Using High Pressure, High Temperature Water, and Water/C02 Mixtures," J. Electrochem. Soc, vol. 145, No. 1, pp. 284–291, Jan. 1998.

Ober, C.K. et al., "Imaging Polymers with Supercritical Carbon Dioxide," Advanced Materials, vol. 9, No. 13, 1039–1043, Nov. 3, 1997.

Russick, E.M. et al., "Supercritical Carbon Dioxide Extraction of Solvent from Micromachined Structures." Supercritical Fluids Extraction and Pollution Prevention, ACS Symposium Series, vol. 670, pp. 255–269,Oct. 21, 1997.

Dahmen, N. et al., "Supercritical Fluid Extraction of Grinding and Metal Cutting Waste Contaminated with Oils," Supercritical Fluids—Extraction and Pollution Prevention, ACS Symposium Series, vol. 670, pp. 270–279, Oct. 21, 1997.

Wai, C.M., "Supercritical Fluid Extraction: Metals as Complexes," Journal of Chromatography A, vol. 785, pp. 369–383, Oct. 17, 1997.

Xu, C. et al., "Submicron–Sized Spherical Yttrium Oxide Based Phosphors Prepared by Supercritical CO2–Assisted aerosolization and pyrolysis," Appl. Phys. Lett., vol. 71, No. 12, Sep. 22, 1997, pp. 1643–1645.

Tomioka Y, et al., "Decomposition of Tetramethylammonium (TMA) in a Positive Photoresist Developer by Supercritical Water," Abstracts of Papers $214^{th}$ ACS Natl Meeting, American Chemical Society, Abstract No. 108, Sep. 7, 1997.

Klein, H. et al., "Cyclic Organic Carbonate Serve as Solvents and Reactive Diluents," Coatings World, pp. 38–40, May 1997.

Bühler, J. et al., Liner Array of Complementary Metal Oxide Semiconductor Double–Pass Metal Micromirrors, Opt. Eng., vol. 36, No. 5, pp. 1391–1398, May 1997.

Jo, M.H. et al., Evaluation of SIO2 Aerogel Thin Film with Ultra Low Dielectric Constant as an Intermetal Dielectric, Microelectronic Engineering, vol. 33, pp. 343–348, Jan. 1997.

McClain, J.B. et al., "Design of Nonionic Surfactants for Supercritical Carbon Dioxide," Science, vol. 27 Dec. 4, 1996, pp. 2049–2052.

Znaidi, L. et al., "Batch and Semi–Continous Synthesis of Magnesium Oxide Powders from Hydrolysis and Supercritical Treatment of Mg(OCH3)2," Materials Research Bulletin, vol. 31, No. 12, pp. 1527–1535, Dec. 1996.

Tadros, M.E., "Synthesis of Titanium Dioxide Particles in Supercritical CO2," J. Supercritical Fluids, vol. 9, pp. 172–176, Sep. 1996.

Courtecuisse, V.G. et al., "Kinetics of the Titanium Isoproproxide Decomposition in Supercritical Isopropyl Alcohol," Ind. Eng. Chem. Res., vol. 35, No. 8, pp. 2539–2545, Aug. 1996.

Gabor, A, et al., "Block and Random Copolymer resists Designed for 193 nm Lithography and Environmentally Friendly Supercritical CO2 Development," Dept. Mat. Sci. & Eng. Cornell Univ., SPIE, vol. 2724, pp. 410–417, Jun. 1995.

Schimek, G. L. et al., "Supercritical Ammonium Synthesis and Characterization of Four New Alkali Metal Silver Antimony Sulfides . . . ," J. Solid State Chemistry, vol. 123 pp. 277–284, May 1996.

Gallagher–Wetmore, P. et al., "Supercritical Fluid Processing: Opportunities for New Resist Materials and Processes," IBM Research Division, SPIE, vol. 2725, pp. 289–299, Apr. 1996.

Papathormas, K.J. et al., "Debonding of Photoresists by Organic Solvents," J. Applied Polymer Science, vol. 59, pp. 2029–2037, Mar. 28, 1996.

Watkins, J.J. et al., "Polymer/metal Nanocomposite Synthesis in Supercritical CO2," Chemistry of Materials, vol. 7, No. 11, Nov. 1995., pp. 1991–1994.

Gloyna, E.F. et al., "Supercritical Water Oxidation Research and Development Update," Environment Progress, vol. 14, No. 3, pp. 182–192.

Gallagher–Wetmore, P. et al., "Supercritical Fluid Processing: A New Dry Technique for Photoresist Developing," IBM Research Division, SPIE vol. 2438, pp. 694–708, Jun. 1995.

Gabor, A. H. et al., "Silicon–Containing Block Copolymer Resist Materials," Microelectronics Technology—Polymers for Advanced Imaging and Packaging , ACS Symposium Series, vol. 614, pp. 281–298, Apr. 1995.

Tsiartas, P.C. et al., "Effect of Molecular weight Distribution on the Dissolution Properties of Novolac Blends," SPIE, vol. 2438, pp. 261–271, 1995.

Allen, R.D. et al., "Performance Properties of Near–monodisperse Novolak Resins,"SPIE, vol. 2438, pp. 250–260, 1995.

Wood, P.T. et al., "Synthesis of New Channeled Structures in Supercritical Amines . . . ," Inorg. Chem., vol. 33, pp. 1556–1558, 1994.

Jerome, J.E. et al., "Synthesis of New Low–Dimensional Quaternary Compounds . . . ," Inorg. Chem, vol. 33, pp. 1733–1734, 1994.

McHardy, J. et al., "Progress in Supercritical CO2 Cleaning," SAMPE Jour., vol. 29, No. 5, pp. 20–27, Sep. 1993.

Purtell, R, et al., "Precision Parts Cleaning using Supercritical Fluids, " J. Vac, Sci, Technol. A. vol. 11, No. 4, Jul. 1993, pp. 1696–1701.

Bok, E, et al., "Supercritical Fluids for Single Wafer Cleaning," Solids State Technology, pp. 117–120, Jun. 1992.

Adschiri, T. et al., "Rapid and Continuous Hydrothermal Crystallization of Metal Oxide Particles in Supercritical Water," J. Am. Ceram. Soc., vol. 75, No. 4, pp. 1019–1022, 1992.

Hansen, B.N. et al., "Supercritical Fluid Transport—Chemical Deposition of Films,"Chem. Mater., vol. 4, No. 4, pp. 749–752, 1992.

Page, S.H. et al., "Predictability and Effect of Phase Behavior of CO2/ Propylene Carbonate in Supercritical Fluid Chromatography," J. Microl. Sep., vol. 3, No. 4, pp. 355–369.

Brokamp, T. et al., "Synthese und Kristallstruktur Eines Gemischtvalenten Lithium–Tanalnitrids Li2Ta3Ns," J. Alloys and Compounds, vol. 176. pp. 47–60, 1991.

Hybertson, B.M. et al., "Deposition of Palladium Films by a Novel Supercritical Fluid Transport Chemical Deposition Process," Mat. Res. Bull., vol. 26, pp. 1127–1133, 1991.

Ziger, D. H. et al., "Compressed Fluid Technology: Application to RIE–Developed Resists," AiChE Jour., vol. 33, No. 10, pp. 1585–1591, Oct. 1987.

Matson, D.W. et al., "Rapid Expansion of Supercritical Fluid Solutions: Solute Formation of Powders, Thin Films, and Fibers," Ind. Eng. Chem. Res., vol. 26, No. 11, pp. 2298–2306, 1987.

Tolley, W.K. et al., "Stripping Organics from Metal and Mineral Surfaces using Supercritical Fluids," Separation Science and Techology, vol. 2+3, pp. 1087–1099, 1987.

"Final Report on the Safety Assessment of Propylene Carbonate," J. American College of Toxicology, vol. 6, No. 2, pp. 23–51, 1987.

Hideaki Itakura et al., "Multi–Chamber Dry Etching System", Solid State Technology, Apr. 1982, pp. 209–214.

Joseph L. Foszcz, "Diaphragm Pumps Eliminate Seal Problems", Plant Engineering, pp. 1–5, Feb. 1, 1996.

Bob Agnew, "WILDEN Air–Operated Diaphragm Pumps", Process & Industrial Training Technologies, Inc., 1996.

* cited by examiner

METHOD OF SUPERCRITICAL PROCESSING OF A WORKPIECE

RELATED APPLICATIONS

This patent application is a divisional application of the co-pending U.S. patent application Ser. No. 09/704,641, filed Nov. 1, 2000, and titled "METHOD AND APPARATUS FOR SUPERCRITICAL PROCESSING OF A WORKPIECE," which claims priority from U.S. Provisional Patent Application Ser. No. 60/163,121, filed Nov. 2, 1999, and titled "A HIGH THROUGHPUT CLUSTER TOOL FOR CLEANING SEMICONDUCTOR DEVICES USING SUPERCRITICAL CO2." The U.S. patent application Ser. No. 09/704,641, filed Nov. 1, 2000, and titled "METHOD AND APPARATUS FOR SUPERCRITICAL PROCESSING OF A WORKPIECE," is hereby incorporated by reference.

FIELD OF THE INVENTION

This invention relates to the field of supercritical processing. More particularly, this invention relates to the field of supercritical processing where a workpiece is processed in a supercritical environment and where the workpiece is processed in a non-supercritical environment.

BACKGROUND OF THE INVENTION

Semiconductor fabrication uses photoresist in ion implantation, etching, and other processing steps. In the ion implantation steps, the photoresist masks areas of a semiconductor substrate that are not implanted with a dopant. In the etching steps, the photoresist masks areas of the semiconductor substrate that are not etched. Examples of the other processing steps include using the photoresist as a blanket protective coating of a processed wafer or the blanket protective coating of a MEMS (micro electromechanical system) device. Following the ion implantation steps, the photoresist exhibits a hard outer crust covering a jelly-like core. The hard outer crust leads to difficulties in a photoresist removal. Following the etching steps, remaining photoresist exhibits a hardened character that leads to difficulties in the photoresist removal. Following the etching steps, residue (photoresist residue mixed with etch residue) coats sidewalls of etch features. Depending on a type of etching step and material etched, the photoresist residue mixed with the etch residue presents a challenging removal problem since the photoresist residue mixed with the etch residue often strongly bond to the sidewalls of the etch features.

Typically, in the prior art, the photoresist and the residue are removed by plasma ashing in an $O_2$ plasma followed by cleaning in a wet-clean bath. A semiconductor etching and metallization process of the prior art is illustrated in block diagram format in FIG. 1. The semiconductor etching and metallization process 10 includes a photoresist application step 12, a photoresist exposure step 14, a photoresist development step 16, a dielectric etch step 18, an ashing step 20, a wet cleaning step 22, and a metal deposition step 24. In the photoresist application step 12, the photoresist is applied to a wafer having an exposed oxide layer. In the photoresist exposure step 14, the photoresist is exposed to light which is partially blocked by a mask.

Depending upon whether the photoresist is a positive or negative photoresist, either exposed photoresist or non-exposed photoresist, respectively, is removed in the photoresist development step 16 leaving a exposed pattern on the oxide layer. In the dielectric etch step 18, the exposed pattern on the oxide layer is etched in an RIE (reactive ion etch) process which etches the exposed pattern into the oxide layer, forming an etched pattern, while also partially etching the photoresist. This produces the residue which coats the sidewalls of the etch features while also hardening the photoresist. In the ashing step 20, the $O_2$ plasma oxidizes and partially removes the photoresist and the residue. In the wet cleaning step 22, remaining photoresist and residue is cleaned in the wet-clean bath.

In the metal deposition step 24, a metal layer is deposited on the wafer filling the etched pattern and also covering non-etched regions. In subsequent processing, at least part of the metal covering non-etched regions is removed in order to form a circuit.

Nishikawa et al. in U.S. Pat. No. 4,944,837, issued on Jul. 31, 1990, recite a prior art method of removing a resist using liquidized or supercritical gas. A substrate with the resist is placed into a pressure vessel, which also contains the liquidized or supercritical gas. After a predetermined time lapse, the liquidized or supercritical gas is rapidly expanded, which removes the resist.

Nishikawa et al. teach that supercritical $CO_2$ can be used as a developer for photoresist. A substrate with a photoresist layer is exposed in a pattern to light, thus forming a latent image. The substrate with the photoresist and the latent image is placed in a supercritical $CO_2$ bath for 30 minutes. The supercritical $CO_2$ is then condensed leaving the pattern of the photoresist. Nishikawa et al. further teach that 0.5% by weight of methyl isobutyl ketone (MIBK) can be added to the supercritical $CO_2$, which increases an effectiveness of the supercritical $CO_2$ and, thus, reduces a development time from the 30 minutes to 5 minutes.

Nishikawa et al. also teach that a photoresist can be removed using the supercritical $CO_2$ and 7% by weight of the MIBK. The substrate with the photoresist is placed in the supercritical $CO_2$ and the MIBK for 30–45 minutes. Upon condensing the supercritical $CO_2$, the photoresist has been removed.

The methods taught by Nishikawa et al. are inappropriate for a semiconductor fabrication line for a number of reasons. Rapidly expanding a liquidized or supercritical gas to remove a photoresist from a substrate creates a potential for breakage of the substrate. A photoresist development process which takes 30 minutes is too inefficient. A photoresist development or removal process which uses MIBK is not preferred because MIBK is toxic and because MIBK is used only when a more suitable choice is unavailable.

Smith, Jr. et al. in U.S. Pat. No. 5,377,705, issued on Jan. 3, 1995, teach a system for cleaning contaminants from a workpiece. The contaminants include organic, particulate, and ionic contaminants. The system includes a pressurizable cleaning vessel, a liquid $CO_2$ storage container, a pump, a solvent delivery system, a separator, a condenser, and various valves. The pump transfers $CO_2$ gas and solvent to the cleaning vessel and pressurizes the $CO_2$ gas to supercritical $CO_2$. The supercritical $CO_2$ and the solvent remove the contaminants from the workpiece. A valve allows some of the supercritical $CO_2$ and the solvent to bleed from the cleaning vessel while the pump replenishes the supercritical $CO_2$ and the solvent. The separator separates the solvent from the supercritical $CO_2$. The condenser condenses the $CO_2$ to liquid $CO_2$ so that the liquid $CO_2$ storage container can be replenished.

Employing a system such as taught by Smith, Jr. et al. for removing photoresist and residue presents a number of difficulties. The pressurizable cleaning vessel is not configured appropriately for semiconductor substrate handling. It is inefficient to bleed the supercritical $CO_2$ and the solvent during cleaning. Such a system is not readily adaptable to throughput requirements of a semiconductor fabrication line. Such a system is not conducive to safe semiconductor substrate handling, which is crucial in a semiconductor fabrication line. Such a system is not economical for semiconductor substrate processing.

What is needed is a method of developing photoresist using supercritical carbon dioxide appropriate for a semiconductor fabrication line.

What is needed is a method of removing photoresist using supercritical carbon dioxide appropriate for a semiconductor fabrication line.

What is needed is a supercritical processing system which is configured for handling semiconductor substrates.

What is needed is a supercritical processing system in which supercritical $CO_2$ and solvent are not necessarily bled from a processing chamber in order to create a fluid flow within the processing chamber.

What is needed is a supercritical processing system which meets throughput requirements of a semiconductor fabrication line.

What is needed is a supercritical processing system which provides safe semiconductor substrate handling.

What is needed is a supercritical processing system which provides economical semiconductor substrate processing.

What is needed is an apparatus which combines an etch process and a supercritical process.

What is needed is an apparatus which combines a deposition process and a supercritical process.

What is needed is an apparatus which combines a supercritical process and a non-supercritical process.

SUMMARY OF THE INVENTION

The present invention is an apparatus for supercritical processing and non-supercritical processing of a workpiece. The apparatus includes a transfer module, a supercritical processing module, a non-supercritical processing module, and a robot. The transfer module includes an entrance. The supercritical processing module and the non-supercritical processing module are coupled to the transfer module. The robot is preferably located within the transfer module. In operation, the robot transfers a workpiece from the entrance of the transfer module to the supercritical processing module. After supercritical processing, the robot then transfers the workpiece from the supercritical processing module to the non-supercritical processing module. After the non-supercritical processing, the robot returns the workpiece to the entrance of the transfer module. Alternatively, the non-supercritical processing is performed before the supercritical processing.

DETAILED DESCRIPTION OF THE PREFERRED EMBODIMENT

Figure 1:
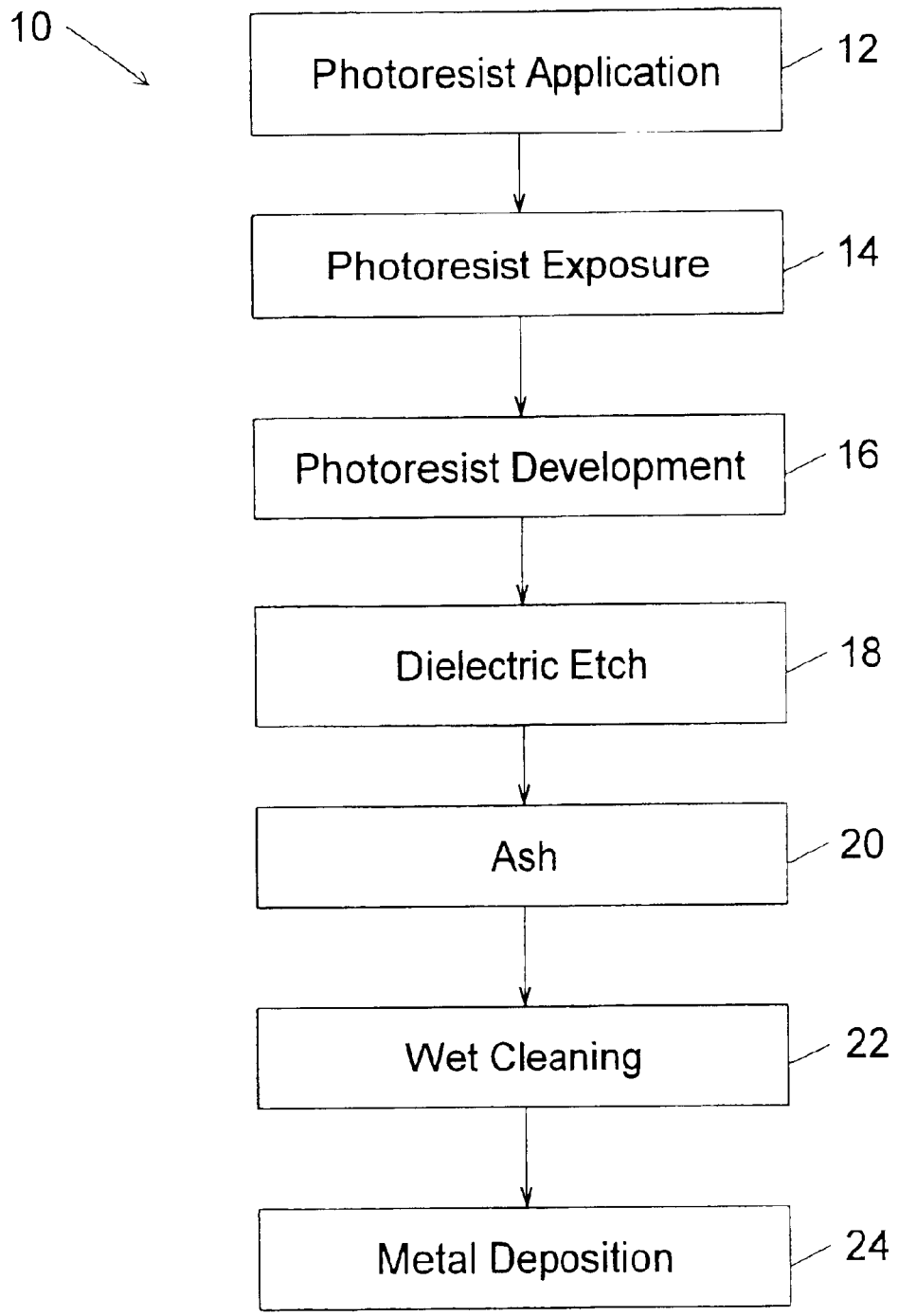
FIG. 1 illustrates, in block diagram format, a process flow for a semiconductor etching and metallization process of the prior art.
Figure 2:
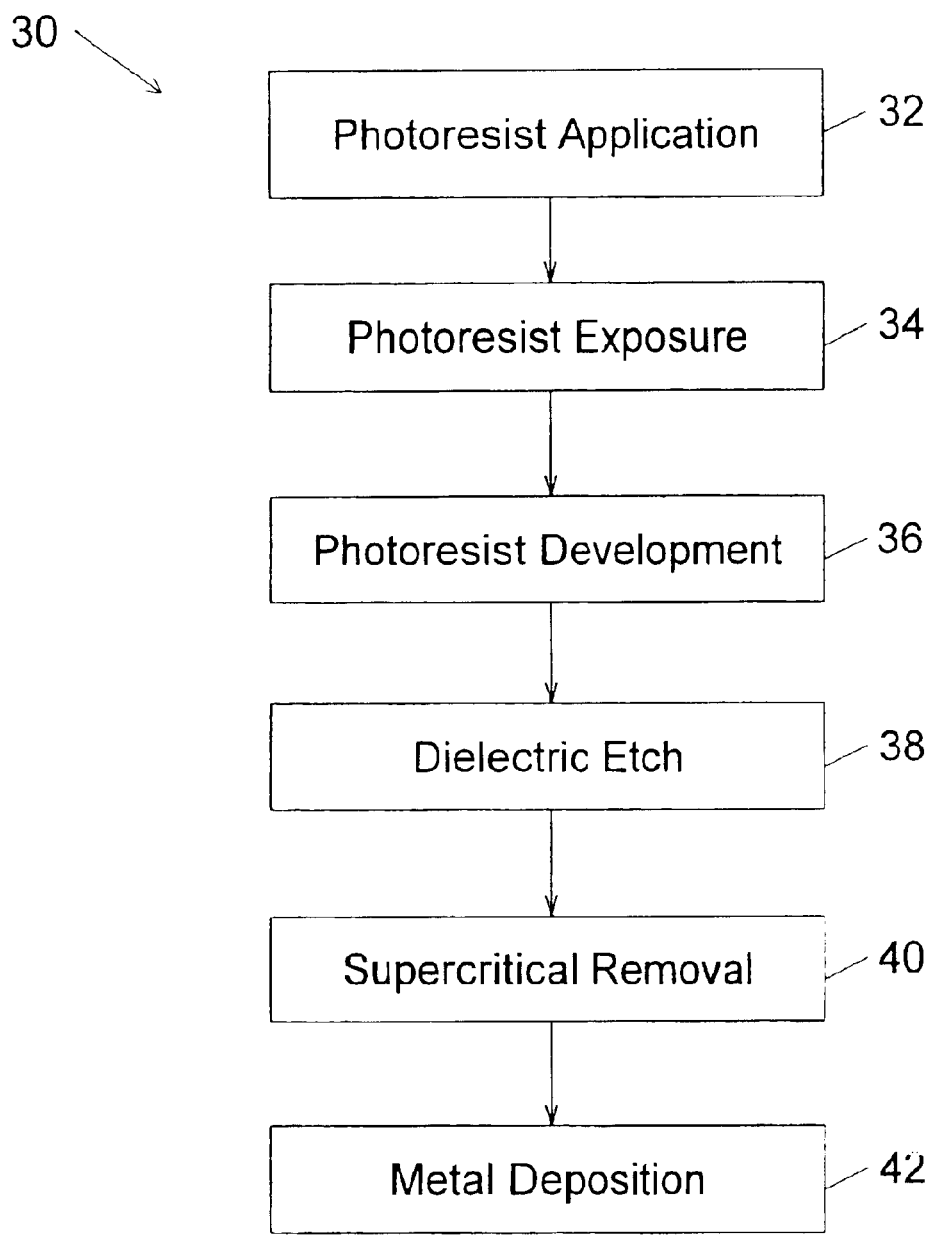
FIG. 2 illustrates, in block diagram format, a process flow for a semiconductor etching and metallization process of the present invention.

A semiconductor etch and metallization process of the present invention is illustrated, as a block diagram, in FIG. 2. The semiconductor etch and metallization process 30 includes a photoresist application step 32, a photoresist exposure step 34, a photoresist development step 36, a dielectric etch step 38, a supercritical removal process 40, and a metal deposition step 42. In the photoresist application step 32, the photoresist is applied to a wafer having an exposed oxide layer. In the photoresist exposure step 34, the photoresist is exposed to light which is partially blocked by a mask.

Depending upon whether the photoresist is a positive or negative photoresist, either exposed photoresist or non-exposed photoresist, respectively, is removed in the photoresist development step 36 leaving a exposed pattern on the oxide layer. In the dielectric etch step 38, the exposed pattern on the oxide layer is preferably etched in an RIE (reactive ion etch) process which etches the exposed pattern into the oxide layer while also partially etching the photoresist. This produces the residue which coats the sidewalls of the etch features while also hardening the photoresist.

In the supercritical removal process 40, supercritical carbon dioxide and a solvent are used to remove the photoresist and the residue. In the metal deposition step 42, a metal layer is deposited on the wafer filling the etched pattern and also covering non-etched regions. In subsequent processing, at least part of the metal covering non-etched regions is removed in order to form a circuit.

Figure 3:
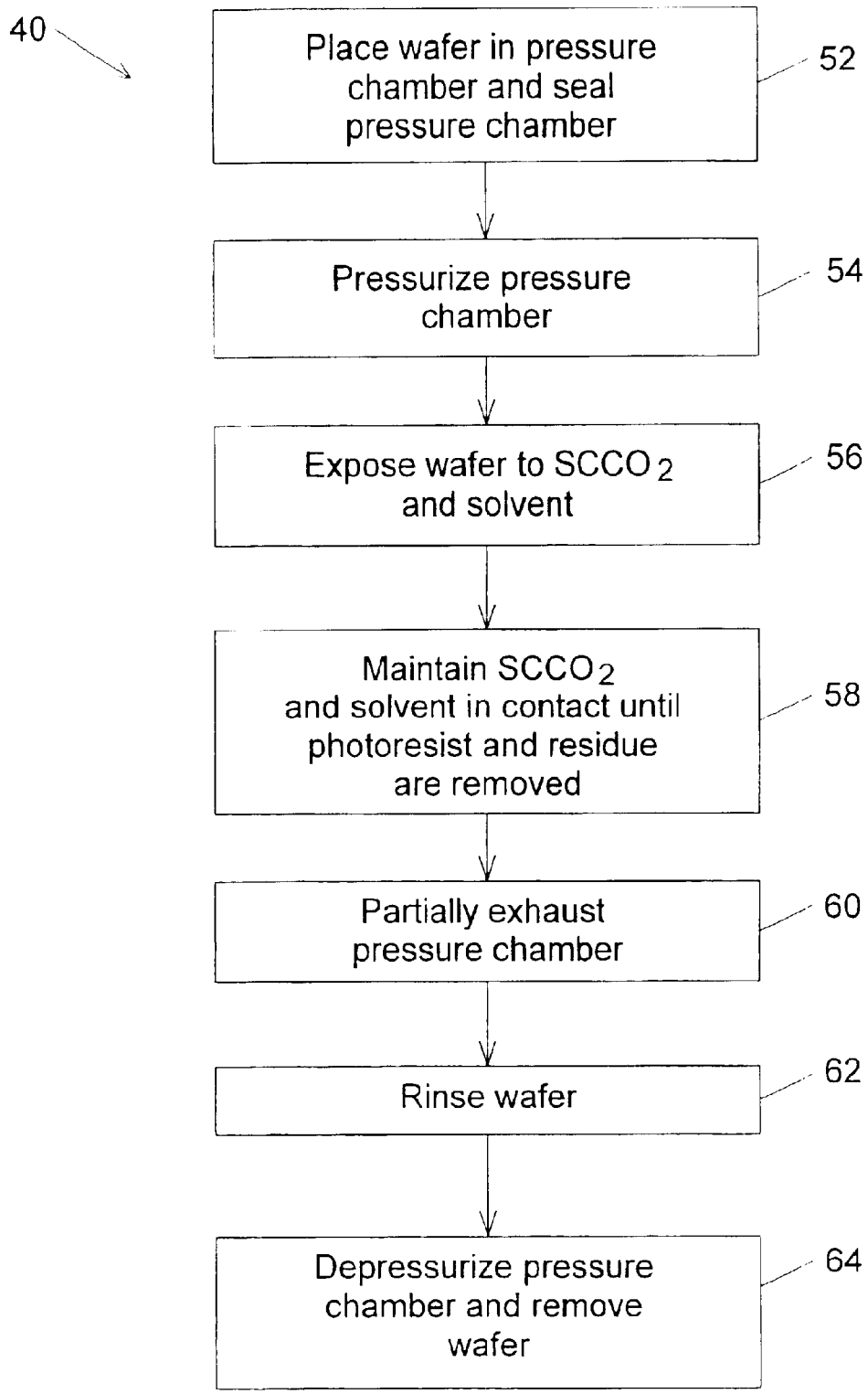
FIG. 3 illustrates, in block diagram format, a supercritical removal process of the present invention.

The supercritical removal process 40 of the present invention is illustrated, as a block diagram, in FIG. 3. The supercritical removal process 40 begins by placing the wafer, with the photoresist and the residue on the wafer, within a pressure chamber and sealing the pressure chamber in a first process step 52. Embodiments of the present invention can be used to process wafers of various sizes, including those having diameters of 3, 4, 5, 6, 8, 12, or more inches. In a second process step 54, the pressure chamber is pressurized with carbon dioxide until the carbon dioxide becomes the supercritical carbon dioxide ($SCCO_2$). In a third process step 56, the supercritical carbon dioxide carries a solvent into the process chamber. In a fourth process step 58, the supercritical carbon dioxide and the solvent are maintained in contact with the wafer until the photoresist and the residue are removed from the wafer. In the fourth process step 58, the solvent at least partially dissolves the photoresist and the residue. In a fifth process step 60, the pressure chamber is partially exhausted. In a sixth process step 62, the wafer is rinsed. In a seventh process step 64, the supercritical removal process 40 ends by depressurizing the pressure chamber and removing the wafer.

Figure 4:
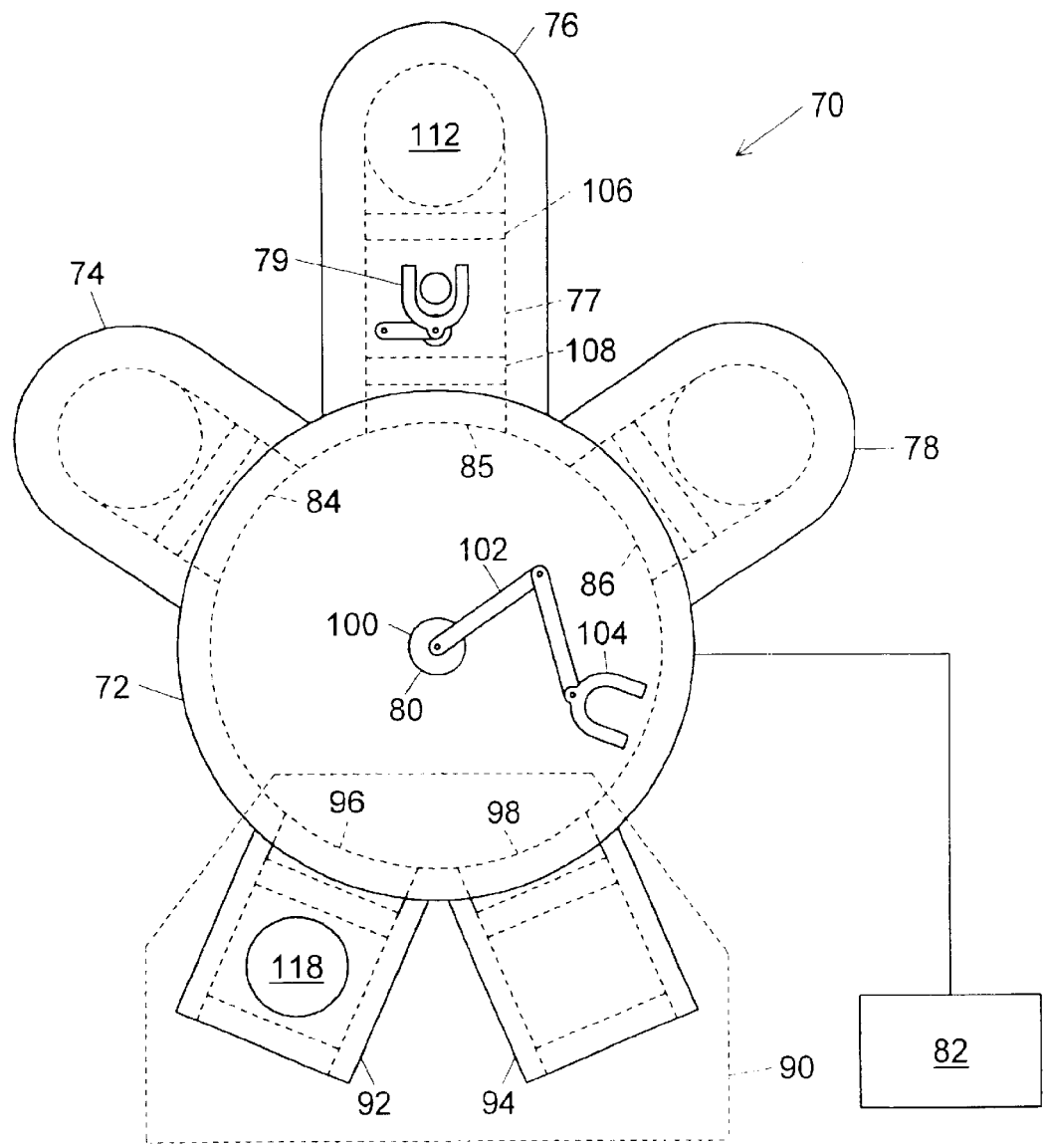
FIG. 4 illustrates the preferred semiconductor processing system of the present invention.

The dielectric etch step 38, the supercritical removal process 40, and the metal deposition step 42 are preferably implemented in a semiconductor fabrication line by the preferred semiconductor processing system of the present invention, which is illustrated in FIG. 4. The preferred semiconductor processing system 70 includes a transfer module 72, an etch module 74, a supercritical processing module 76, an ante-chamber 77, an ante-chamber robot 79, a deposition module 78, a transfer module robot 80, and control electronics 82. The transfer module 72 includes first through third process ports, 84–86, and a transfer module entrance 90. The transfer module entrance 90 includes first and second hand-off stations, 92 and 94, and first and second entrance ports, 96 and 98.

The etch module 74, the supercritical processing module 76 via the ante-chamber 77, and the deposition module 78 are preferably coupled to the transfer module 72 via the first through third process ports, 84–86, respectively. Preferably, the transfer module robot 80 is coupled to the transfer module 72 at a center of the transfer module 72. The first and second hand-off stations, 92 and 94, are coupled to the transfer module via the first and second entrance ports, 96 and 98, respectively. Preferably, the first and second hand-off stations, 92 and 94, comprise first and second loadlocks, respectively. The control electronics 82 are coupled to the transfer module 72.

Preferably, the transfer module 72 operates at low to high vacuum. Preferably, the etch module 74 is an RIE (reactive ion etch) module. The RIE module preferably operates at the high vacuum. Preferably, the deposition module 78 is a PVD (physical vapor deposition) module. The PVD module preferably operates at very-high vacuum or ultra-high vacuum.

It will be readily apparent to one skilled in the art that the RIE module could be replaced by an alternative etch module such as a plasma etch module. Further, it will be readily apparent to one skilled in the art that the PVD module could be replaced by an alternative deposition module such as a CVD (chemical vapor deposition) module. Moreover, it will be readily apparent to one skilled in the art that the preferred semiconductor processing system 70 could be configured with just the etch module 74 and the supercritical processing module 76, or with just the supercritical processing module 76 and the deposition module 78.

The transfer module robot 80 preferably includes a robot base 100, a robot arm 102, and an end effector 104. The robot base is coupled to the transfer module 72. The robot arm 102 is preferably a two piece robot arm, which couples the end effector 104 to the robot base 100. The end effector 104 is configured to pick and place workpieces. Preferably, the end effector 104 is configured to pick and place the wafer. Alternatively, the end effector 104 is configured to pick and place a puck or other substrate. Alternatively, a dual arm robot replaces the transfer module robot 80, where the dual arm robot includes two arms and two end effectors.

The supercritical processing module 76 preferably includes a first gate valve 106. The first-gate valve 106 couples a workpiece cavity 112 to the ante-chamber 77. The ante-chamber 77 preferably includes a second gate valve 108. The second gate valve 108 couples the ante-chamber 77 to the transfer module 72.

Preferably, in operation, the transfer module robot 80 transfers the workpiece 118 from the first hand-off station 92 to the etch module 74, where the dielectric etch step 38 is performed. Next, the transfer module robot 80 transfers the wafer 118 from the etch module 74, to the transfer module 72, and to the ante-chamber 77 of the supercritical processing module 76. The second gate valve 108 then closes and the ante-chamber 77 is preferably pressurized with carbon dioxide. In one embodiment, the ante-chamber 77 is pressurized to a pressure similar to a processing pressure within the supercritical processing module 76. In a preferred embodiment, this pressure generated within the ante-chamber 77 is at least 1,000 psi, and is generated using supercritical $CO_2$, inert gases, nitrogen, or any similar gases. Next, the ante-chamber robot 79 transfers the workpiece 118 from the ante-chamber 77 to the supercritical processing module 76, where the supercritical removal process 40 is performed. Following this, the workpiece is removed from the supercritical processing module 76 to the ante-chamber 77 by the ante-chamber robot 79. Next, the ante-chamber is evacuated by a vacuum pump (not shown). Preferably, the vacuum pump comprising a turbo-pump. Then, the second gate valve 108 opens and the transfer module robot 80 transfers the workpiece 118 from the supercritical processing module 76 to the deposition module 78, where the metal deposition step 42 is performed. Subsequently, the transfer module robot 80 transfers the workpiece 118 from the metal deposition module 78 to the second hand-off station 94.

Preferably, the workpiece 118 is the wafer. Preferably, the wafer is in a first cassette with other wafers at the first hand-off station 92 prior to the transfer module robot 80 moving the wafer to the etch module 74. It will be readily apparent to one skilled in the art that some of the other wafers can be processed simultaneously with the wafer. For example, while the wafer is within the deposition module 78, a second wafer could be within the supercritical processing module 76, and a third wafer could be within the etch module 74.

Preferably, the wafer is placed by the transfer module robot 80 in a second cassette at the second hand-off station 94 following the metal deposition step. Alternatively, the wafer begins and ends in the first cassette at the first hand-off station 92 along with the other wafers while a second group of wafers begins and ends in the second cassette at the second hand-off station 94.

It will be readily apparent to one skilled in the art that the second hand-off station 94 can be eliminated or that additional hand-off stations can be added to the preferred semiconductor processing system 70. Further, it will be readily apparent to one skilled in the art that the transfer module robot 80 can be replaced by a transfer mechanism which is configured to transfer the workpiece 118. Moreover, it will be readily apparent to one skilled in the art that the first and second cassettes can be front opening unified pods which employ a standard mechanical interface concept so that the wafers can be maintained in a clean environment separate from a surrounding environment.

Figure 5:
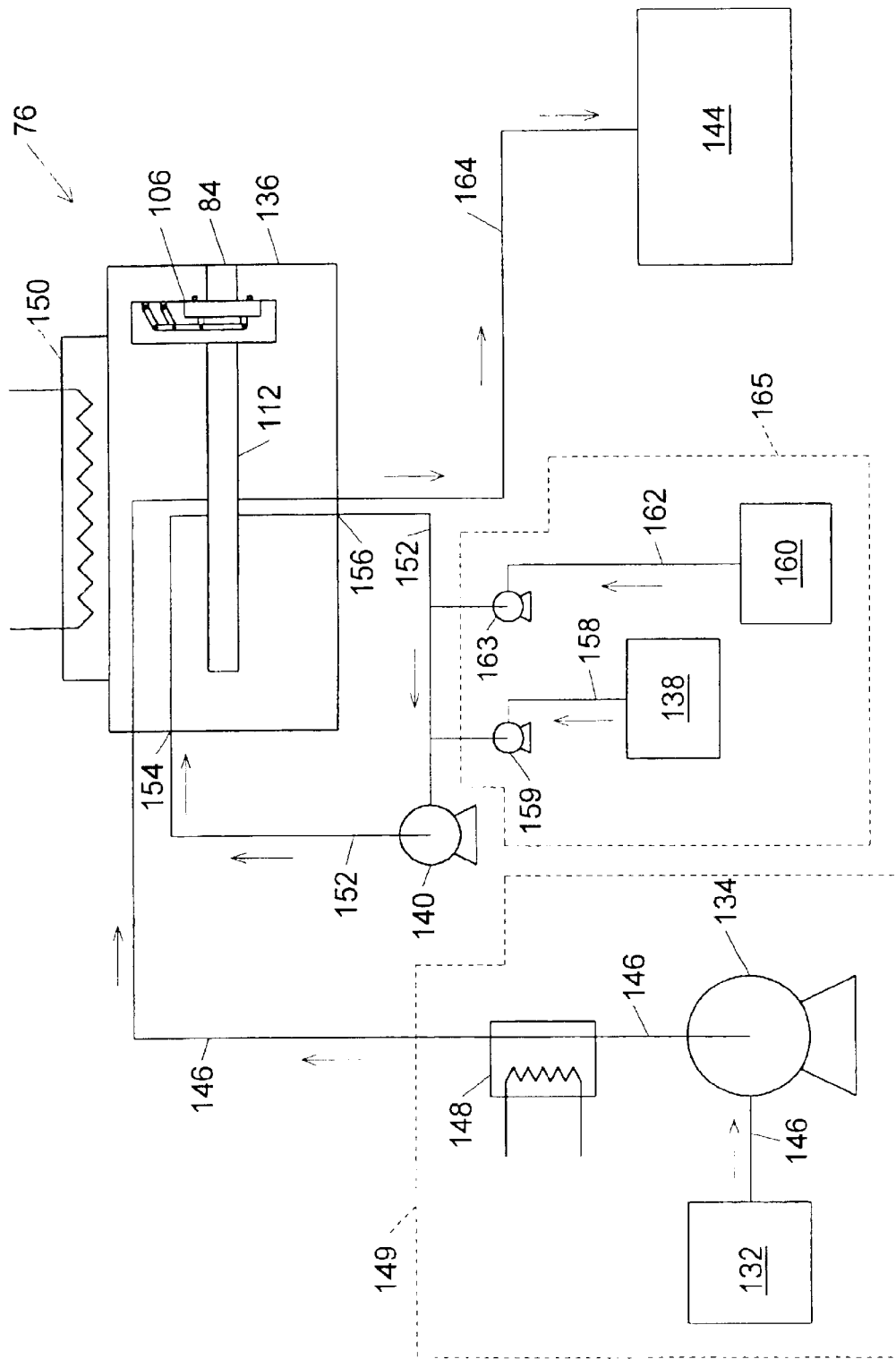
FIG. 5 illustrates the preferred semiconductor processing module of the present invention.

The supercritical processing module 76 of the present invention is illustrated in FIG. 5. The supercritical processing module 76 includes a carbon dioxide supply vessel 132, a carbon dioxide pump 134, the pressure chamber 136, a chemical supply vessel 138, a circulation pump 140, and an exhaust gas collection vessel 144. The carbon dioxide supply vessel 132 is coupled to the pressure chamber 136 via the carbon dioxide pump 134 and carbon dioxide piping 146. The carbon dioxide piping 146 includes a carbon dioxide heater 148 located between the carbon dioxide pump 134 and the pressure chamber 136. The pressure chamber 136 includes a pressure chamber heater 150. The circulation pump 140 is located on a circulation line 152, which couples to the pressure chamber 136 at a circulation inlet 154 and at a circulation outlet 156. The chemical supply vessel 138 is coupled to the circulation line 152 via a chemical supply line 158, which includes a first injection pump 159. A rinse agent supply vessel 160 is coupled to the circulation line 152 via a rinse supply line 162, which includes a second injection pump 163. The exhaust gas collection vessel 144 is coupled to the pressure chamber 136 via exhaust gas piping 164.

The carbon dioxide supply vessel 132, the carbon dioxide pump 134, and the carbon dioxide heater 148 form a carbon dioxide supply arrangement 149. The chemical supply vessel 138, the first injection pump 159, the rinse agent supply vessel 160, and the second injection pump 163 form a chemical and rinse agent supply arrangement 165.

It will be readily apparent to one skilled in the art that the supercritical processing module 76 includes valving, control electronics, filters, and utility hookups which are typical of supercritical fluid processing systems.

Referring to FIGS. 3, 4, and 5, implementation of the supercritical removal method 40 begins with the first process step 52, in which the wafer, having the photoresist or the residue (or both the photoresist and the residue) is inserted into the wafer cavity 112 of the pressure chamber 136 by the ante-chamber robot 79 and, then, the pressure chamber 136 is sealed by closing the gate valve 106. In the second process step 54, the pressure chamber 136 is pressurized by the carbon dioxide pump 134 with the carbon dioxide from the carbon dioxide supply vessel 132. During the second step 54, the carbon dioxide is heated by the carbon dioxide heater 148 while the pressure chamber 136 is heated by the pressure chamber heater 150 to ensure that a temperature of the carbon dioxide in the pressure chamber 136 is above a critical temperature. The critical temperature for the carbon dioxide is 31° C. Preferably, the temperature of the carbon dioxide in the pressure chamber 136 is within a range of 45° C. to 75° C. Alternatively, the temperature of the carbon dioxide in the pressure chamber 136 is maintained within a range of from 31° C. to about 100° C.

Upon reaching initial supercritical conditions, the first injection pump 159 pumps the solvent from the chemical supply vessel 138 into the pressure chamber 136 via the circulation Line 152 while the carbon dioxide pump further pressurizes the supercritical carbon dioxide in the third process step 56. At a beginning of a solvent injection, the pressure in the pressure chamber 136 is preferably about 1,100–1,200 psi. Once a desired amount of the solvent has been pumped into the pressure chamber 136 and desired supercritical conditions are reached, the carbon dioxide pump 134 stops pressurizing the pressure chamber 136, the first injection pump 159 stops pumping the solvent into the pressure chamber 136, and the circulation pump 140 begins circulating the supercritical carbon dioxide and the solvent in the fourth process step 58. Preferably, the pressure at this point is about 2,700–2,800 psi. By circulating the supercritical carbon dioxide and the solvent, the supercritical carbon dioxide maintains the solvent in contact with the wafer. Additionally, by circulating the supercritical carbon dioxide and the solvent, a fluid flow enhances removal of the photoresist and the residue from the wafer.

Preferably, the wafer is held stationary in the pressure chamber 136 during the fourth process step 58. Alternatively, the wafer is spun within the pressure chamber 136 during the fourth process step 58.

After the photoresist and the residue has been removed from the wafer, the pressure chamber 136 is partially depressurized by exhausting some of the supercritical carbon dioxide, the solvent, removed photoresist, and removed residue to the exhaust gas collection vessel 144 in order to return conditions in the pressure chamber 136 to near the initial supercritical conditions in the fifth process step 60. Preferably, the pressure within the pressure chamber 136 is cycled at least once at this point by raising the pressure and then again partially exhausting the pressure chamber 136. This enhances a cleanliness within the pressure chamber 136. In the fifth process step 60, the pressure chamber is preferably maintained above the critical temperature and above a critical pressure. The critical pressure for carbon dioxide is 1,070 psi.

In the sixth process step 62, the second injection pump 163 pumps a rinse agent from the rinse agent supply vessel 160 into the pressure chamber 136 via the circulation line while the carbon dioxide pump 134 pressurizes the pressure chamber 136 to near the desired supercritical conditions and, then, the circulation pump 140 circulates the supercritical carbon dioxide and the rinse agent in order to rinse the wafer. Preferably, the rinse agent is selected from the group consisting of water, alcohol, acetone, and a mixture thereof. More preferably, the rinse agent is the mixture of the alcohol and the water. Preferably, the alcohol is selected from the group consisting of isopropyl alcohol, ethanol, and other low molecular weight alcohols. More preferably, the alcohol is selected from the group consisting of the isopropyl alcohol and the ethanol. Most preferably, the alcohol is the ethanol.

Preferably, the wafer is held stationary in the pressure chamber 136 during the sixth process step 62. Alternatively, the wafer is spun within the pressure chamber 136 during the sixth process step 62.

In the seventh process step 64, the pressure chamber 136 is depressurized, by exhausting the pressure chamber 136 to the exhaust gas collection vessel 144, the gate valve 106 is opened, and the wafer is removed from the pressure chamber 136 by the ante-chamber robot 77.

Alternative supercritical removal processes of the present invention are taught in the following patent applications, all of which are incorporated in their entirety by reference: U.S. patent application, filed on Oct. 25, 2000; U.S. pat. application Ser. No. 09/389,788, filed on Sep. 3, 1999; U.S. patent application Ser. No. 09/085,391, filed on May 27, 1998; and U.S. Provisional Patent Application No. 60/047,739, filed May 27, 1997.

Figure 6:
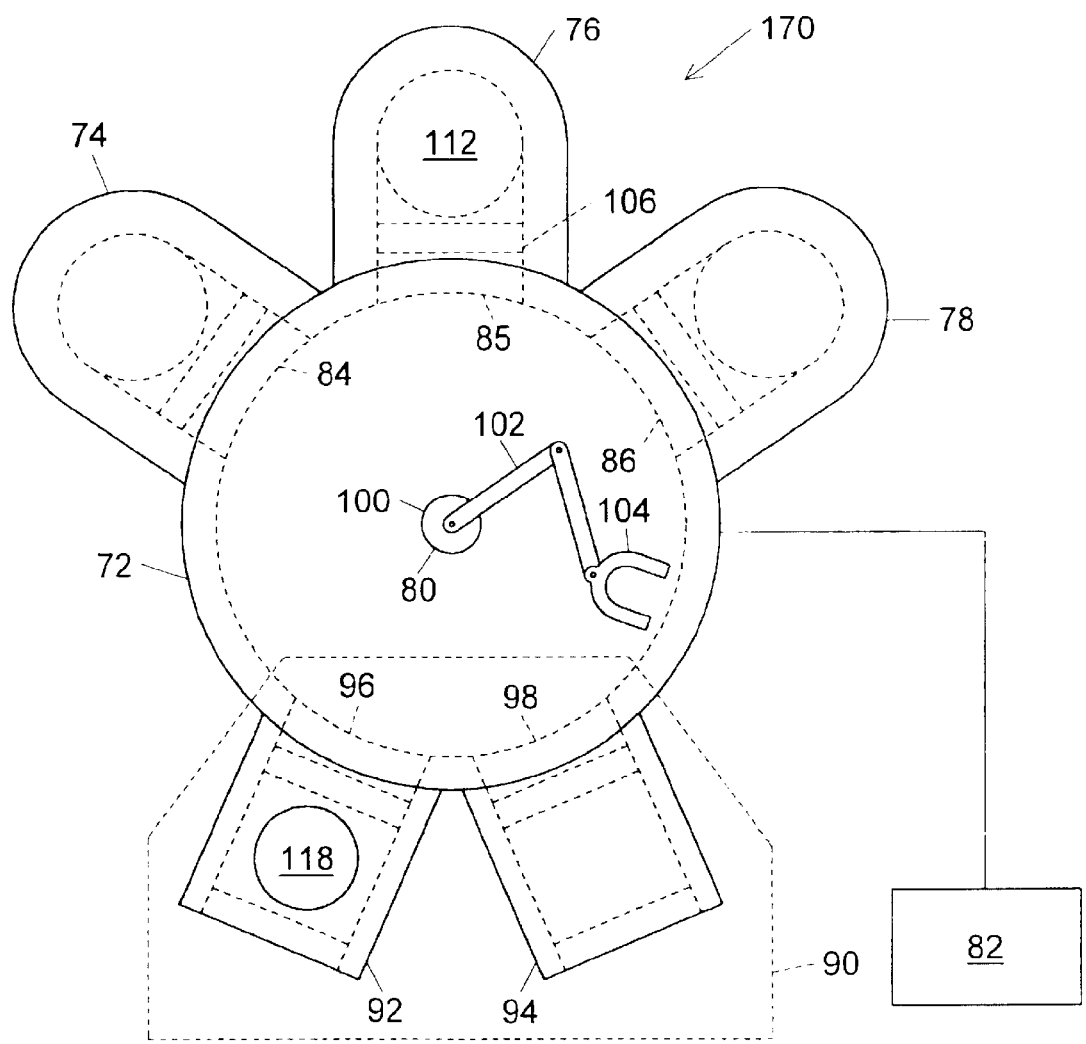
FIG. 6 illustrates a first alternative semiconductor processing system of the present invention.

A first alternative semiconductor processing system of the present invention is illustrated in FIG. 6. The first alternative semiconductor processing system 170 removes both the ante-chamber 77 and the ante-chamber robot 79 from the preferred semiconductor processing system 70. In the first alternative semiconductor processing system 170, the supercritical processing module 76 is preferably coupled directly to the second processing port 85 and the vacuum pump is coupled to the supercritical processing module 76. Thus, in the first alternative semiconductor processing system 170, the supercritical processing module 76 operates between vacuum and supercritical conditions.

Figure 7:
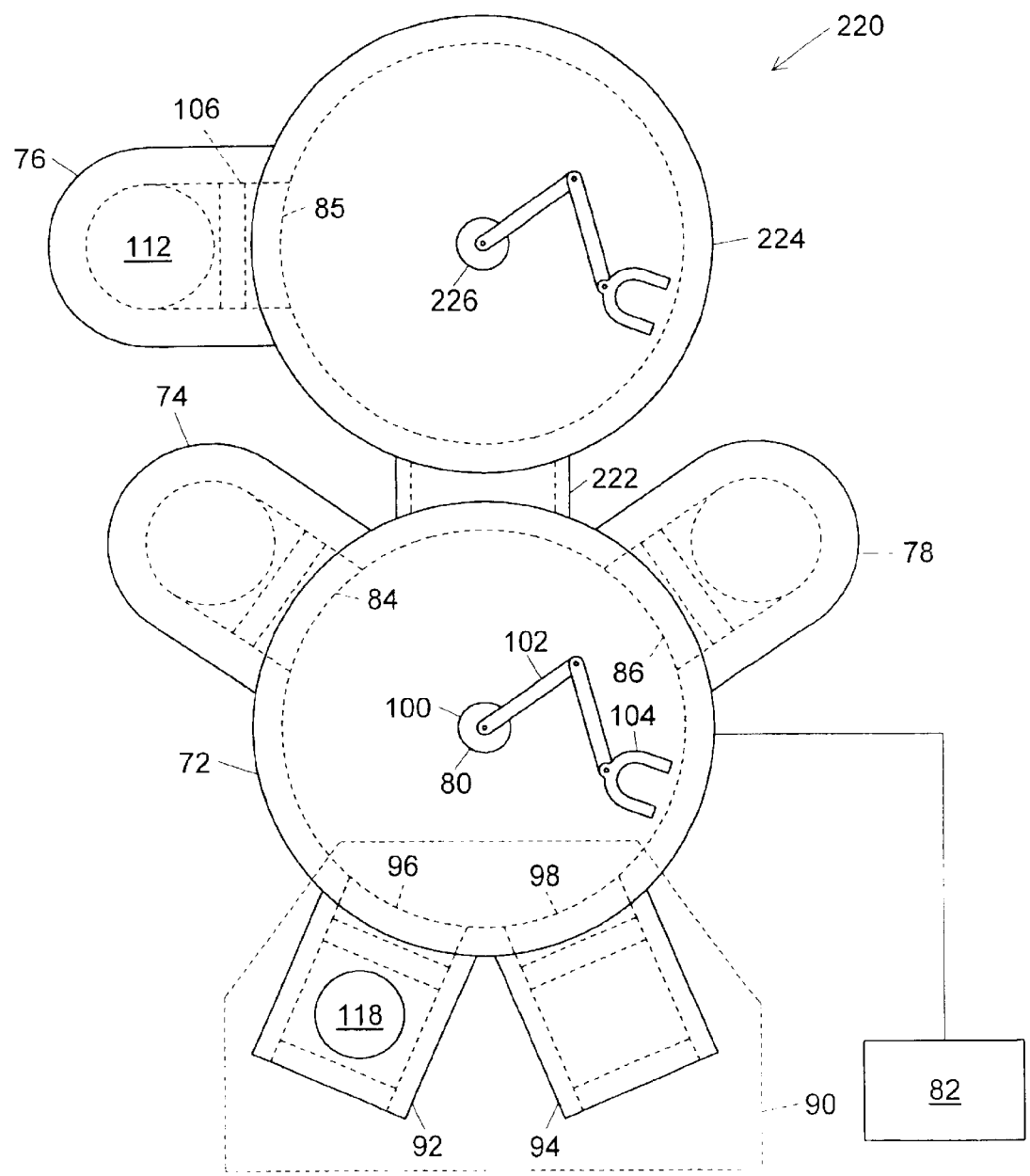
FIG. 7 illustrates a second alternative semiconductor processing system of the present invention.

A second alternative semiconductor processing system of the present invention is illustrated in FIG. 7. The second alternative semiconductor processing system 220 adds a third hand-off station 222, a second transfer module 224, and a second transfer module robot 226 to the preferred semiconductor processing system 70. In the second alternative semiconductor processing system 220, the third hand-off station 222 couples the transfer module 72 to the second transfer module 224. The second transfer module robot 226 preferably resides in the second transfer module 224. The etch module 74 and the deposition module 78 are preferably coupled to the transfer module 72 while the supercritical processing module 76 is preferably coupled to the second transfer module 224. Thus, the second alternative semiconductor processing system 220 preferably separates the supercritical processing module 76 from the etch and deposition modules, 74 and 78, which operate at vacuum. In this way, a process cleanliness is enhanced. Alternatively, in the second alternative semiconductor processing system 220, a fourth hand-off station is added between the transfer module 72 and the second transfer module 224.

Figure 8:
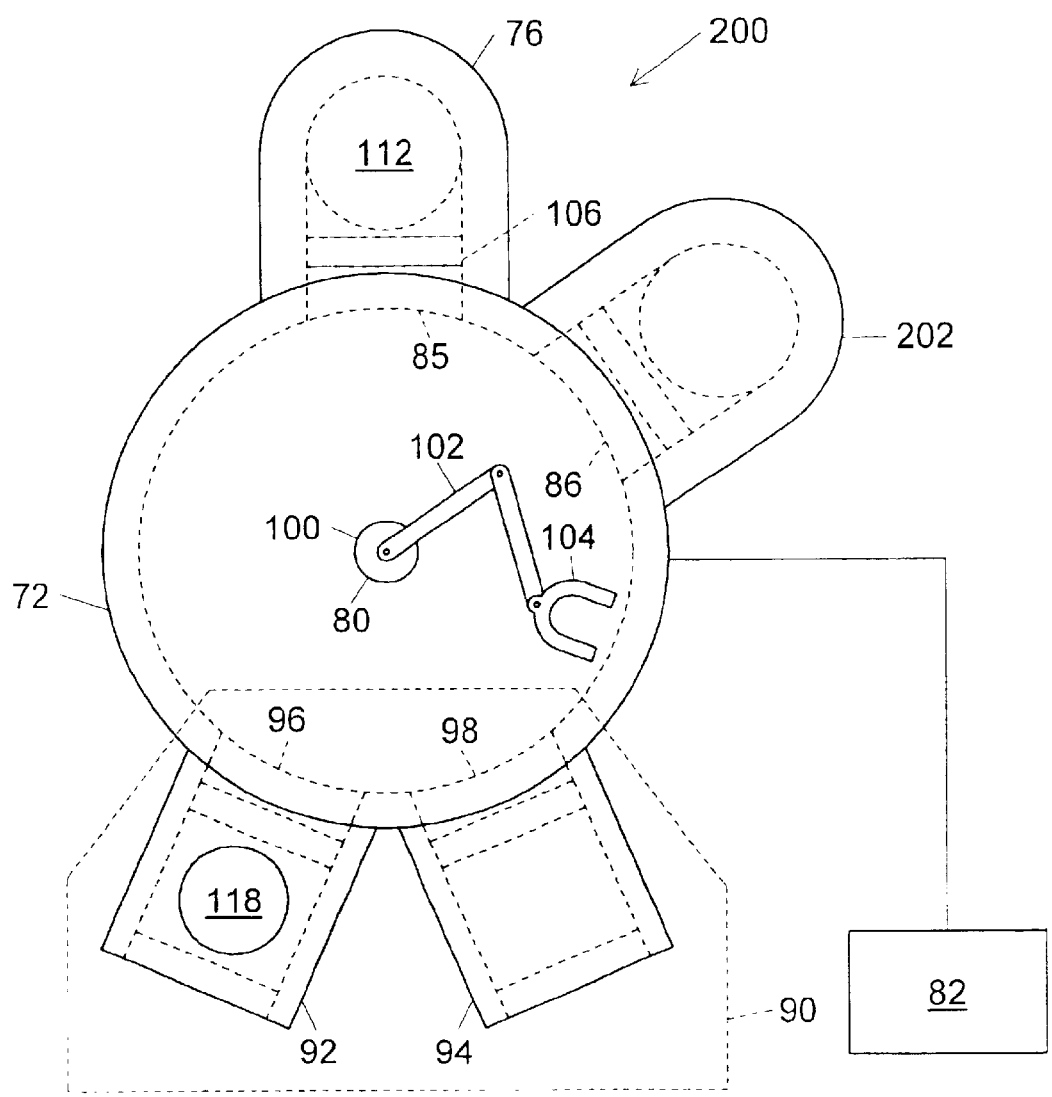
FIG. 8 illustrates a third alternative semiconductor processing system of the present invention.

A third alternative semiconductor processing system of the present invention is illustrated in FIG. 8. The third alternative semiconductor processing system 200 includes the transfer module 72, the supercritical processing module 76, the transfer module robot 80, and a non-supercritical processing module 202. The non-supercritical processing module is preferably a semiconductor processing module. The semiconductor processing module is preferably selected from the group consisting of an etch module, a physical vapor deposition module, a chemical vapor deposition module, an electroplating module, a chemical mechanical planarization module, a photolithography module, an ashing module, a scrubbing module, and an other semiconductor processing module.

In a fourth alternative semiconductor processing system of the present invention, the transfer module 72 of the preferred semiconductor processing system 70 is not operated at vacuum and the first and second hand-off stations, 92 and 94, are preferably not loadlocks. Rather, the transfer module 72 operates at atmospheric pressure or at a slight positive pressure relative to the surrounding environment where the slight positive pressure is produced by an inert gas injection arrangement. The inert gas injection arrangement injects an inert gas, such as Ar, $CO_2$, or $N_2$, into the transfer module 72. This assures a cleaner processing environment within the transfer module 72 if the transfer module is not operated at vacuum.

A fifth alternative semiconductor processing system of the present invention eliminates the transfer module 72 of the fourth alternative semiconductor processing system. In the fifth alternative semiconductor processing system, the transfer module robot 80 is simple a robot that is configured to move workpieces between the first and second hand-off stations, 92 and 94, and the etch module 74, the supercritical processing module 76, and the deposition module 78 without benefitting from a covering effect provided by the transfer module 72.

A sixth alternative semiconductor processing system of the present invention adds an inspection station to the preferred semiconductor processing system 70. In the sixth alternative semiconductor processing system, the workpiece 118 is transferred to the inspection station prior to being transferred to the deposition module 78. At the inspection station, an inspection of the workpieces 118 ensures that the photoresist and the residue have been removed from the workpieces. Preferably, the inspection station uses spectroscopy to inspect the workpieces. Alternatively, the inspection station is incorporated within the supercritical processing module 76.

Alternatively, in operation of the sixth alternative semiconductor processing system, the workpiece 118 is transferred to the inspection station directly from the etch module 74 if it is anticipated that the photoresist will be etched to completion and if it is anticipated that the residue will not be deposited. Thus, if the inspection station finds that no photoresist remains and also finds no residue, the supercritical removal process 40 will be skipped.

A seventh alternative semiconductor processing system of the present invention adds a front-end robot to the preferred semiconductor processing system 70. In the seventh alternative semiconductor processing system, the front-end robot resides outside of the entrance to the transfer module 72 and the first and second cassettes are located away from the first and second hand-off stations, 92 and 94. The front-end robot is preferably configured to move the wafers from the first cassette to the first hand-off station 92 and is also preferably configured to move the wafers from the second hand-off station 94 to the second cassette.

Figure 9:
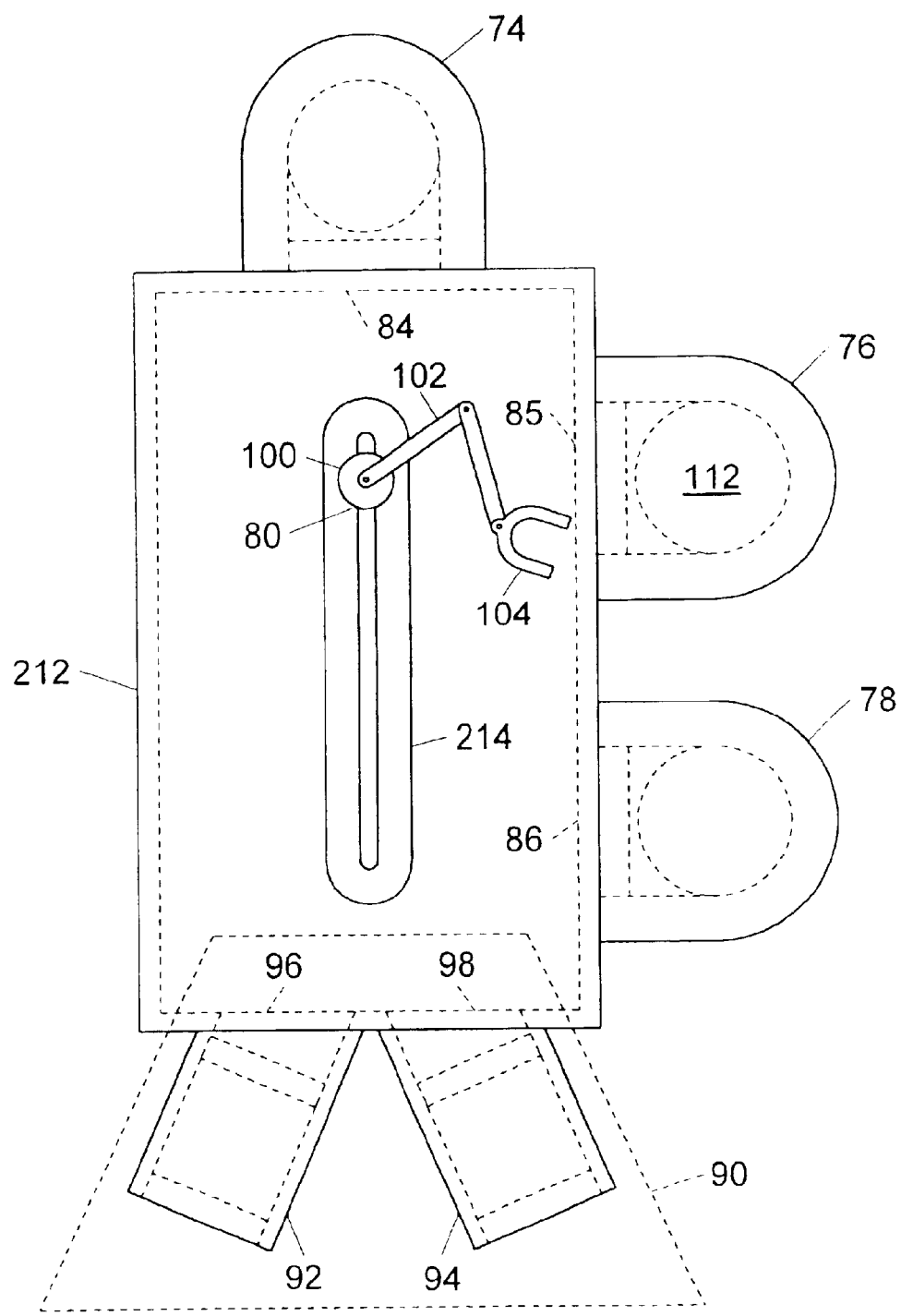
FIG. 9 illustrates an eighth alternative semiconductor processing system of the present invention.

An eighth alternative semiconductor processing systems of the present invention is illustrated in FIG. 9. The eighth semiconductor processing system 210 comprises an alternative transfer module 212 and a robot track 214.

An ninth alternative semiconductor processing system of the present invention adds a wafer orientation mechanism to the preferred semiconductor processing system 70. The wafer orientation mechanism orients the wafer according to a flat, a notch, or an other orientation indicator. Preferably, the wafer is oriented at the first hand-off station 92. Alternatively, the wafer is oriented at the second hand-off station 94.

A first alternative supercritical processing module of the present invention replaces the pressure chamber 136 and gate valve 106 with an alternative pressure chamber. The alternative pressure chamber comprises a chamber housing and a hydraulically driven wafer platen. The chamber housing comprises a cylindrical cavity which is open at its bottom. The hydraulically driven wafer platen is configured to seal against the chamber housing outside of the cylindrical cavity. In operation, the wafer is placed on the hydraulically driven wafer platen. Then, the hydraulically driven wafer platen moves upward and seals with the chamber housing. Once the wafer has been processed, the hydraulically driven wafer platen is lowered and the wafer is taken away.

A second alternative supercritical processing module of the present invention places alternative inlets for the circulation line 152 to enter the wafer cavity 112 at a circumference of the wafer cavity 112 and places an alternative outlet at a top center of the wafer cavity 112. The alternative inlets are preferably configured to inject the supercritical carbon dioxide in a plane defined by the wafer cavity 112. Preferably, the alternative inlets are angled with respect to a radius of the wafer cavity 112 so that in operation the alternative inlets and the alternative outlet create a vortex within the wafer cavity 112.

It will be readily apparent to one skilled in the art that other various modifications may be made to the preferred embodiment without departing from the spirit and scope of the invention as defined by the appended claims.

We claim:

1. A method of supercritical processing of a first workpiece having a residue on a surface of the workpiece comprising the steps of:

a. transferring the first workpiece from an entrance of a transfer module into the transfer module;

b. transferring the first workpiece to a supercritical processing module having a workpiece cavity while maintaining the first workpiece in a clean environment, the step of transferring the first workpiece to the supercritical processing module comprising:

i. transferring the first workpiece from the transfer module to an antechamber;

ii. pressurizing the antechamber to a pressure above 1,000 psi; and iii. transferring the first workpiece from the antechamber to the workpiece cavity;

c. processing the first workpiece in the workpiece cavity in a supercritical environment until at least a portion of the residue is removed from the surface of the workpiece, the workpiece cavity maintaining a substantially constant volume during processing;

d. transferring the first workpiece to the non-supercritical processing module while maintaining the first workpiece in a clean environment;

e. processing the first workpiece in the non-supercritical processing module; and f. returning the first workpiece to the entrance of the transfer module.

2. The method of claim 1 wherein the entrance of the transfer module comprises a hand-off station.

3. The method of claim 2 wherein the entrance of the transfer module further comprises an additional hand-off station.

4. The method of claim 1, wherein the step of processing the first workpiece in the supercritical processing module comprises:

a. introducing a processing material into the supercritical processing module; and b. adjusting the processing material in the supercritical processing module to supercritical conditions.

5. The method of claim 4, wherein the processing material is carbon dioxide.

6. The method of claim 4, wherein the step of processing the first workpiece in the supercritical processing module comprises the steps of:

a. generating supercritical conditions in the supercritical processing module;

b. injecting a solvent into the supercritical processing module;

c. circulating the processing material and solvent within the supercritical processing module; and d. exhausting a portion of the processing material and solvent from the supercritical processing module.

7. The method of claim 6, further comprising the step of holding the first workpiece stationary during the step of processing the first workpiece in the supercritical processing module.

8. The method of claim 6, further comprising the step of spinning the first workpiece during the step of processing the first workpiece in the supercritical processing module.

9. The method of claim 6, further comprising the steps of:

a. adjusting the pressure within the supercritical processing module; and b. exhausting the processing material and the solvent from the supercritical processing module.

10. The method of claim 6, further comprising the steps of:

a. introducing a rinse agent into the supercritical processing module;

b. introducing the processing material into the supercritical processing module;

c. circulating the processing material and the rinse agent within the supercritical processing module; and d. exhausting the processing material and the rinse agent from the supercritical processing module.

11. The method of claim 10, wherein the rinse agent is selected from the group consisting essentially of water, alcohol, acetone, and mixtures thereof.

12. The method of claim 11, wherein the alcohol is selected from the group consisting essentially of isopropyl alcohol, ethanol, and other low molecular weight alcohols.

13. The method of claim 1, further comprising the step of maintaining a slight positive pressure in the transfer module.

14. The method of claim 13, wherein the step of maintaining a slight positive pressure comprises injecting an inert gas into the transfer module.

15. The method of claim 14, wherein the inert gas is selected from the group consisting essentially of Ar, $CO_2$, and $N_2$.

16. The method of claim 1, further comprising the step of maintaining a pressure approximately equal to the atmospheric pressure in the transfer module.

17. The method of claim 1, wherein the step of processing the first workpiece in the non-supercritical processing module comprises one of inspecting, aligning, etching, physical vapor depositing, chemical vapor depositing, electroplating, chemical mechanical planarizing, photolithography, ashing, and scrubbing.

18. The method of claim 1, further comprising processing a second workpiece in the non-supercritical processing module while the first workpiece is being processed in the workpiece cavity.

19. The method of claim 1, wherein the residue is one of a photoresist residue and an etch residue.

20. The method of claim 1, wherein a pressure within the wafer cavity exceeds 1,500 psi.

21. The method of claim 1, wherein the workpiece has a diameter larger than 8 inches.

* * * * *